United States Patent
Araki et al.

(10) Patent No.: US 10,814,610 B2
(45) Date of Patent: Oct. 27, 2020

(54) LITHOGRAPHIC PRINTING PLATE PRECURSOR, METHOD FOR PRODUCING LITHOGRAPHIC PRINTING PLATE, AND LITHOGRAPHIC PRINTING METHOD

(71) Applicant: FUJIFILM Corporation, Tokyo (JP)

(72) Inventors: Kenjiro Araki, Shizuoka (JP); Shizuka Ishikawa, Shizuoka (JP); Taira Murakami, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 16/792,900

(22) Filed: Feb. 18, 2020

(65) Prior Publication Data
US 2020/0180299 A1    Jun. 11, 2020

Related U.S. Application Data

(63) Continuation of application No. PCT/JP2018/030704, filed on Aug. 20, 2018.

(30) Foreign Application Priority Data

Aug. 31, 2017 (JP) .................... 2017-167434

(51) Int. Cl.
| | | |
|---|---|---|
| B41F 7/24 | (2006.01) | |
| B41C 1/10 | (2006.01) | |
| B41N 1/14 | (2006.01) | |

(52) U.S. Cl.
CPC .............. $B41F\ 7/24$ (2013.01); $B41C\ 1/1008$ (2013.01); $B41N\ 1/14$ (2013.01)

(58) Field of Classification Search
None
See application file for complete search history.

(56) References Cited

U.S. PATENT DOCUMENTS

| | | | |
|---|---|---|---|
| 6,098,544 A | 8/2000 | Figov | |
| 8,679,726 B2 | 3/2014 | Balbinot et al. | |
| 2004/0110082 A1* | 6/2004 | Ide ..................... | B41N 1/14 |
| | | | 430/138 |

FOREIGN PATENT DOCUMENTS

| | | |
|---|---|---|
| EP | 2343195 | 7/2011 |
| JP | 2001033973 | 2/2001 |
| JP | 2003025531 | 1/2003 |
| JP | 2003276351 | 9/2003 |
| JP | 2015519610 | 7/2015 |
| JP | 2017047564 | 3/2017 |
| WO | 2015122513 | 8/2015 |

OTHER PUBLICATIONS

"International Search Report (Form PCT/ISA/210)" of PCT/JP2018/030704, dated Oct. 2, 2018, with English translation thereof, pp. 1-5.
"Written Opinion of the International Searching Authority (Form PCT/ISA/237)" of PCT/JP2018/030704, dated Oct. 2, 2018, with English translation thereof, pp. 1-7.
"Search Report of Europe Counterpart Application", dated Aug. 10, 2020, p. 1-p. 7.

* cited by examiner

*Primary Examiner* — Joshua D Zimmerman
(74) *Attorney, Agent, or Firm* — JCIPRNET

(57) ABSTRACT

Provided is a lithographic printing plate precursor having: a support; and an image-recording layer as an outermost surface layer on the support, in which the image-recording layer includes a hydrophilic polymer, an ion intensity derived from the hydrophilic polymer has a maximum value I1, the ion intensity being measured by a time-of-flight secondary ion mass spectrometry in such a manner that cutting is carried out from an image-recording layer surface in a direction of the support by an Ar gas cluster ion beam method, a ratio d0/d1 of a thickness d0 of the image-recording layer to a depth d1 from an outermost layer at which the I1 is obtained is 2.0 or more, and a ratio I1/I0 of the I1 to an ion intensity I0 derived from the hydrophilic polymer at a depth from the outermost layer of the d0 is 1.5 or more.

15 Claims, No Drawings

LITHOGRAPHIC PRINTING PLATE PRECURSOR, METHOD FOR PRODUCING LITHOGRAPHIC PRINTING PLATE, AND LITHOGRAPHIC PRINTING METHOD

CROSS-REFERENCE TO RELATED APPLICATIONS

This application is a continuation application of International Application No. PCT/JP2018/030704, filed Aug. 20, 2018, the disclosure of which is incorporated herein by reference in its entirety. Further, this application claims priority from Japanese Patent Application No. 2017-167434, filed Aug. 31, 2017, the disclosure of which is incorporated herein by reference in its entirety.

BACKGROUND OF THE INVENTION

1. Field of the Invention

The present invention relates to a lithographic printing plate precursor, a method for producing a lithographic printing plate, and a lithographic printing method.

2. Description of the Related Art

After the formation of an image (after exposure), a lithographic printing plate precursor is developed (processed) in order to remove a non-image area in an image-forming layer. There is a case where the lithographic printing plate precursor is designed so that an overcoating layer such as a water-soluble topcoating layer or a water-soluble oxygen impermeable barrier layer is disposed on a photosensitive image-forming layer. This overcoating layer is used to improve a high polymerization rate during the formation of an image by ensuring, for example, a higher image-forming layer sensitivity.

As a lithographic printing plate precursor having such an overcoating layer (protective layer), for example, a lithographic printing plate precursor described in JP2015-519610A is exemplified.

JP2015-519610A describes a negative-type lithographic printing plate precursor including a substrate, a negative-type image-forming layer disposed on the substrate which includes a free radical polymerizable component, an initiator composition capable of generating a free radical in the case of being exposed to radiated light for the formation of an image, a radiated light absorber, and a polymer binder, and an outermost water-soluble overcoating layer directly disposed on the negative-type image-forming layer which includes (1) one or a plurality of existing film-forming water-soluble polymer binders and (2), with respect to the total weight of the outermost water-soluble overcoating layer, at least 1.3% by weight and a maximum of 60% by weight of organic wax particles dispersed in the one or a plurality of existing film-forming water-soluble polymer binders, in which the organic was particles have an average maximum dimension of at least 0.05 µm and a maximum of 0.7 µm which is measured from a scanning electron microphotograph of the dried outermost water-soluble overcoating layer.

SUMMARY OF THE INVENTION

There is a case where lithographic printing plate precursors are manufactured in a state in which several dozen or several hundred plate precursors are overlaid together and transported. During transportation, a method in which interleaving paper is inserted between the respective plate precursors is carried out in order to prevent a surface of a lithographic printing plate precursor on an image-recording layer side from being damaged by scratching by another plate precursor.

However, the present inventors found that, even in a case where interleaving paper is inserted, there is a case where, during a transportation operation (for example, during the removal of the interleaving paper using an automated plate loader) or the like, the topcoating layer present on the surface on the image-recording layer side is damaged by scratching and the exposure sensitivity of a scratched region degrades.

JP2015-519610A describes a lithographic printing plate having an overcoating layer having excellent scratch resistance which is intended to suppress the generation of the above-described damage. In the present disclosure, in a case where damage is not easily generated on the surface of the lithographic printing plate precursor even in a case where a scratch is generated on the surface of the lithographic printing plate precursor, it is said that "scratch resistance is excellent".

However, the present inventors found that, after a lithographic printing plate is produced by developing the lithographic printing plate precursor having an overcoating layer described in JP2015-519610A, an ink-absorbing property (hereinafter, also simply referred to as the "ink-absorbing property") degrades. This is considered to be because, in the lithographic printing plate precursor having an overcoating layer described in JP2015-519610A, a water-soluble component included in the overcoating layer on an outermost layer (image-recording layer) of an image area remains after development.

An object that an embodiment of the present invention attempts to achieve is to provide a lithographic printing plate precursor having excellent scratch resistance and providing an excellent ink-absorbing property to a lithographic printing plate to be obtained, a method for producing the same, and a lithographic printing method in which the lithographic printing plate precursor is used.

Means for achieving the above-described object includes the following aspects.

<1> A lithographic printing plate precursor, comprising:
a support; and
an image-recording layer as an outermost surface layer on the support,
in which the image-recording layer comprises a hydrophilic polymer,
an ion intensity derived from the hydrophilic polymer has a maximum value I1, the ion intensity being measured by a time-of-flight secondary ion mass spectrometry in such a manner that cutting is carried out from an image-recording layer surface in a direction of the support by an Ar gas cluster ion beam method,
a ratio d0/d1 of a thickness d0 of the image-recording layer to a depth d1 from an outermost layer at which the I1 is obtained is 2.0 or more, and
a ratio I1/I0 of the I1 to an ion intensity I0 derived from the hydrophilic polymer at a depth from the outermost layer of the d0 is 1.5 or more.

<2> The lithographic printing plate precursor according to <1>, in which the d0/d1 is 2.5 or more, and the I1/I0 is 1.8 or more.

<3> The lithographic printing plate precursor according to <1> or <2>, in which the hydrophilic polymer comprises a polysaccharide.

<4> The lithographic printing plate precursor according to any one of <1> to <3>, in which the hydrophilic polymer comprises a water-soluble cellulose compound.

<5> The lithographic printing plate precursor according to any one of <1> to <4>, in which the hydrophilic polymer comprises hydroxyalkyl cellulose.

<6> The lithographic printing plate precursor according to any one of <1> to <5>, in which a content of the hydrophilic polymer is 0.1% by mass to 20% by mass with respect to a total mass of the image-recording layer.

<7> The lithographic printing plate precursor according to any one of <1> to <6>, in which a water contact angle of the image-recording layer surface is 45° to 700.

<8> The lithographic printing plate precursor according to any one of <1> to <7>, in which the image-recording layer further comprises an infrared absorber, a polymerization initiator, and a polymerizable compound.

<9> The lithographic printing plate precursor according to any one of <1> to <8>, in which the image-recording layer further comprises a polymer particle.

<10> The lithographic printing plate precursor according to <9>, in which the polymer particle comprises a styrene-acrylonitrile copolymer.

<11> The lithographic printing plate precursor according to any one of <1> to <10>, in which the image-recording layer further comprises an acid color former.

<12> The lithographic printing plate precursor according to <8>, in which the polymerization initiator comprises an electron-donating polymerization initiator and an electron-receiving polymerization initiator.

<13> The lithographic printing plate precursor according to any one of <1> to <12>, which is an on-machine development-type lithographic printing plate precursor.

<14> A method for producing a lithographic printing plate, comprising:
subjecting the lithographic printing plate precursor according to any one of <1> to <13> to image-wise light exposure; and
removing an image-recording layer in a non-image area by supplying at least one selected from the group consisting of printing ink and dampening water in a printer.

<15> A lithographic printing method, comprising:
subjecting the lithographic printing plate precursor according to any one of <1> to <13> to image-wise light exposure;
removing a non-image area in an image-recording layer in a printer by supplying at least one selected from the group consisting of printing ink and dampening water to produce a lithographic printing plate; and
carrying out printing using the obtained lithographic printing plate.

According to an embodiment of the present invention, it is possible to provide a lithographic printing plate precursor having excellent scratch resistance and providing an excellent ink-absorbing property to a lithographic printing plate to be obtained, a method for producing the same, and a lithographic printing method in which the lithographic printing plate precursor is used.

DESCRIPTION OF THE PREFERRED EMBODIMENTS

Hereinafter, the contents of the present disclosure will be described in detail. Constituent requirements mentioned below will be described on the basis of typical embodiments of the present disclosure, but the present disclosure is not limited to such embodiments.

Meanwhile, in the present specification, a numerical range expressed using "to" includes numeric values described before and after "to" as the lower limit value and the upper limit value.

In addition, in the present specification, a group (atomic group) that is not expressed whether the group is substituted or not substituted refers to both a group not having a substituent and a group having a substituent. For example, an "alkyl group" refers not only to an alkyl group not having a substituent (unsubstituted alkyl group) but also to an alkyl group having a substituent (substituted alkyl group).

In the present specification, "(meth)acryl" is an expression used with a concept of including both acryl and methacryl, and "(meth)acryloyl" is an expression used with a concept of including both acryloyl and methacryloyl.

In addition, in the present specification, regarding the expression of a group in a compound represented by a formula, in a case where a group that is not described to be "substituted" or "unsubstituted" is capable of further having a substituent, unless particularly otherwise described, the group refers not only to an unsubstituted group but also to a group having a substituent. For example, in a formula, the expression "R represents an alkyl group, an aryl group, or a heterocyclic group" means that "R represents an unsubstituted alkyl group, a substituted alkyl group, an unsubstituted aryl group, a substituted aryl group, an unsubstituted heterocyclic group, or a substituted heterocyclic group".

In addition, the term "step" in the present specification refers not only to an independent step but also a step that cannot be clearly differentiated from other steps as long as the intended purpose of the step is achieved. In addition, in the present disclosure, "% by mass" and "% by weight" have the same meaning, and "parts by mass" and "parts by weight" have the same meaning.

Furthermore, in the present disclosure, a combination of two or more preferred aspects is a more preferred aspect.

In addition, unless particularly otherwise described, the weight-average molecular weight (Mw) and the number average molecular weight (Mn) in the present disclosure refer to a molecular weight that is detected using a gel permeation chromatography (GPC) analyzer in which columns of TSKgel GMHxL, TSKgel G4000HxL, and TSKgel G2000HxL (all are trade names manufactured by Tosoh Corporation) are used, solvent tetrahydrofuran (THF), and a differential refractometer and is converted using polystyrene as a standard substance.

In the present specification, the term "lithographic printing plate precursor" refers not only to a lithographic printing plate precursor but also to a key plate precursor. In addition, the term "lithographic printing plate" refers not only to a lithographic printing plate produced by carrying out operations such as exposure and development as necessary on the lithographic printing plate precursor but also to a key plate. In the case of the key plate precursor, the operations such as exposure and development are not necessarily required. Meanwhile, the key plate refers to a lithographic printing plate precursor intended to be attached to a plate cylinder that is not used in a case where monochromatic or dichromatic printing is carried out on a part of paper during, for example, color newspaper printing.

Hereinafter, the present disclosure will be described in detail.

(Lithographic Printing Plate Precursor)

A lithographic printing plate precursor according to an embodiment of the present disclosure has an image-recording layer as an outermost surface layer on a support, the image-recording layer includes a hydrophilic polymer, in a case where cutting is carried out from an image-recording layer surface in a support direction using an Ar gas cluster ion beam method, an ion intensity derived from the hydrophilic polymer measured by a time-of-flight secondary ion mass spectrometry has a maximum value I1, a ratio d0/d1 of a thickness d0 of the image-recording layer to a depth d1 from an outermost layer which is obtained from the I1 is 2.0 or more, and a ratio I1/I0 of the I1 to an ion intensity I0 derived from the hydrophilic polymer at a depth from the outermost layer of the d0 is 1.5 or more.

That is, the lithographic printing plate precursor according to the embodiment of the present disclosure has the support and the image-recording layer that is the outermost surface layer formed on the support, the image-recording layer includes a hydrophilic polymer, cutting is carried out from the image-recording layer surface in the support direction using the Ar gas cluster ion beam method, the ion intensity derived from the hydrophilic polymer measured by the time-of-flight secondary ion mass spectrometry has the maximum value I1, the ratio d0/d1 of the thickness d0 of the image-recording layer to the depth d1 from the outermost layer which is obtained from the I1 is 2.0 or more, and the ratio I1/I0 of the I1 to the ion intensity I0 derived from the hydrophilic polymer at the depth from the outermost layer of the d0 is 1.5 or more.

In addition, the lithographic printing plate precursor according to the embodiment of the present disclosure is preferably an on-machine development-type lithographic printing plate precursor.

As a result of intensive studies, the present inventors found that, in a case where the above-described constitution is provided, it is possible to provide a lithographic printing plate precursor having excellent scratch resistance and providing an excellent ink-absorbing property to a lithographic printing plate to be obtained.

An action mechanism of obtaining the above-described effect is not clear, but is assumed as below.

In a case where the hydrophilic polymer is unevenly distributed at a location at which d0/d1 reaches 2.0 or more in an amount in which I1/I0 reaches 1.5 or more, the image-recording layer is protected by the hydrophilic polymer, and thus the scratch resistance improves.

The hydrophilic polymer is included in the image-recording layer. Therefore, it is considered that, on the outermost surface, the hydrophilic polymer is in a state of being at least mixed with other components in the image-recording layer and the components included in the image-recording layer other than the hydrophilic polymer are exposed on at least part of the outermost surface. The detail is not clear, but is assumed that, in the lithographic printing plate precursor according to the embodiment of the present disclosure, for example, the hydrophilic polymer is present inside the outermost surface or the hydrophilic polymer is present on the surface in a discontinuous state.

Therefore, it is considered that, compared with a case where a hydrophilic layer such as an overcoating layer including the hydrophilic polymer is formed on the image-recording layer, the lithographic printing plate precursor according to the embodiment of the present disclosure is excellent in terms of the ink-absorbing property.

In addition, according to the above-described aspect, it is easy to obtain a lithographic printing plate precursor being excellent in terms of a property of transmitting water or a water-based development fluid and developability.

<Image-Recording Layer>

The lithographic printing plate precursor according to the embodiment of the present disclosure has an image-recording layer as the outermost surface layer.

The image-recording layer in the lithographic printing plate precursor according to the embodiment of the present disclosure preferably can be removed by any or both of dampening water and printing ink from the viewpoint of enabling on-machine development.

[Outermost Surface Layer]

The outermost surface layer refers to, among layers constituting the lithographic printing plate precursor, a layer farthest from the support on one surface of the support.

Here, having the image-recording layer as the outermost surface layer means that at least a part of the outermost surface layer is the image-recording layer, and the part of the outermost surface layer may be the image-recording layer or all of the outermost surface layer may be the image-recording layer.

[Hydrophilic Polymer]

The image-recording layer of the lithographic printing plate precursor according to the embodiment of the present disclosure includes a hydrophilic polymer.

Here, the hydrophilic polymer is not particularly limited as long as the hydrophilic polymer is a polymer that improves the property of transmitting water by being included in the image-recording layer.

In the present disclosure, the polymer refers to a compound having a weight average molecular weight of 1,000 or more.

The hydrophilic polymer is preferably a water-soluble polymer compound.

The water-soluble polymer compound is a polymer compound that dissolves as much as one gram or more in 100 g of water at 25° C., preferably a polymer compound that dissolves as much as five grams or more in 100 g of water at 25° C., and more preferably a polymer compound that dissolves as much as 10 grams or more in 100 g of water at 25° C.

The c Log P value of the hydrophilic polymer is preferably −3.0 to 1.0, more preferably −3.0 to 0.0, and still more preferably −3.0 to −0.5.

The c Log P value is a value of the common logarithm log P of a partition coefficient P to 1-octanol and water obtained by calculation. As a method or software used for the calculation of the c Log P value, well-known method or software can be used; however, in the present disclosure, unless particularly otherwise described, a c Log P program combined into ChemBioDraw Ultra 12.0 by CambridgeSoft Corporation is used.

The image-recording layer may singly contain one hydrophilic polymer or may contain two or more hydrophilic polymers.

The content of the hydrophilic polymer is preferably 0.1% by mass to 20% by mass, more preferably 1% by mass to 10% by mass, and particularly preferably 2.5% by mass to 10% by mass of the total mass of the image-recording layer.

(The content of the hydrophilic polymer is preferably 1% by mass to 40% by mass, more preferably 2% by mass to 35% by mass, and particularly preferably 5% by mass to 30% by mass of the total mass of the image-recording layer.)

The water-soluble polymer preferably has at least one selected from the group consisting of a structure including a hydroxy group, a structure including a pyrrolidone ring, and a structure including an oxyalkylene group, which have an affinity particularly to water, as a repeating unit and more preferably has a structure including an oxyalkylene group as a repeating unit.

As specific examples of the water-soluble polymer including a hydroxy group, gum arabic, soya gum, carboxymethyl cellulose, hydroxymethyl cellulose, hydroxyethyl cellulose, polyhydroxyethylated cellulose, hydroxypropyl cellulose, hydroxypropylmethyl cellulose, glyoxalized hydroxypropylmethyl cellulose, hydroxypropylmethyl cellulose phthalate, methyl cellulose, and polyvinyl alcohol are exemplified.

As specific examples of the water-soluble polymer including a pyrrolidone ring, polyvinyl pyrrolidone and a copolymer of vinyl pyrrolidone and vinyl acetate are exemplified.

As specific examples of the water-soluble polymer including an oxyalkylene group, polyalkylene glycols such as polyethylene glycol and polyoxyethylene polyoxypropylene glycol (also referred to as polyoxyethylene-polyoxypropylene condensate), polyoxyalkylene monoalkyl or aryl ethers such as poly(ethylene glycol) methyl ether or poly(ethylene glycol) phenyl ether, polyglycerins such as polyoxyethylene polyoxypropylene alkyl ether, polyglycerin, polyoxyethylene glycerin, and polyoxyethylene polyoxypropylene glyceryl ether or esters thereof, polyoxyethylene monoester, and polyoxyethylene alkyl ether ester are preferably used.

Among these, the hydrophilic polymer preferably includes a polysaccharide and, from the viewpoint of both developability and an ink-absorbing property, more preferably includes a water-soluble cellulose compound.

The polysaccharide is not particularly limited as long as the polysaccharide is water-soluble, and polysaccharides, polysaccharide derivatives, alkali metal salts thereof, and the like are exemplified.

The water-soluble cellulose compound refers to a water-soluble compound in which a part of cellulose is modified.

As the water-soluble cellulose compound, a compound in which at least a part of a hydroxyl group in cellulose is substituted with at least one selected from the group consisting of an alkyl group or a hydroxyalkyl group is preferably exemplified.

As the water-soluble cellulose compound, alkyl cellulose or hydroxyalkyl cellulose is preferred, and hydroxyalkyl cellulose is more preferred.

As the water-soluble cellulose compound, hydroxypropyl cellulose or methyl cellulose is preferably exemplified.

The weight average molecular weight (Mw) of the hydrophilic polymer that is used in the present disclosure can be randomly set by the performance design of the lithographic printing plate precursor.

Here, the weight average molecular weight (Mw) of the hydrophilic polymer is preferably 1,000 to 200,000, more preferably 3,000 to 100,000, and still more preferably 5,000 to 70,000. In a case where the weight average molecular weight is in the above-described range, the developability and the scratch resistance are superior. The weight average molecular weight (Mw) of the water-soluble polymer compound can be measured by the gel permeation chromatography (GPC) method in which polyethylene glycol is used as a standard substance.

[Ion Intensity Derived from Hydrophilic Polymer]

In the image-recording layer that is used in the present disclosure, cutting is carried out from the image-recording layer surface in the support direction using the Ar gas cluster ion beam method, the ion intensity derived from the hydrophilic polymer measured by the time-of-flight secondary ion mass spectrometry has the maximum value I1, the ratio d0/d1 of the thickness d0 of the image-recording layer to the depth d1 from the outermost layer which is obtained from the I1 is 2.0 or more, and the ratio I1/I0 of the I1 to the ion intensity I0 derived from the hydrophilic polymer at the depth from the outermost layer of the d0 is 1.5 or more.

—Ar Gas Cluster Ion Beam Method—

The Ar gas cluster ion beam method is a method in which an Ar gas cluster is caused to hit the image-recording layer surface using a sputter ion gun of PHI nano TOF II (registered trademark) manufactured by Ulvac-Phi, Inc., thereby etching the surface by means of ion sputtering.

—Time-of-Flight Secondary Ion Mass Spectrometry—

The time-of-flight secondary ion mass spectrometry (TOF-SIMS) is a method in which an ion beam (primary ion) is radiated to a solid specimen and the mass of an ion discharged from the surface (secondary ion) is separated using a time-of-flight difference (the time-of-flight is proportional to the square root of weight) and is measured using PHI nano TOF II (registered trademark) manufactured by Ulvac-Phi, Inc.

—Depth d1 from Outermost Layer at which I1 is Obtained—

The intensities of an ion intrinsic to the hydrophilic polymer at individual depths are measured by the time-of-flight secondary ion mass spectrometry while etching the surface using the Ar gas cluster ion beam method, and a depth at which the intensity is highest is specified as the depth d1 from the outermost layer. The ion intensity at the depth d1 from the outermost layer is regarded as the ion intensity I1.

The sampling interval of data in a thickness direction of the image-recording layer is set to 10 nm to 30 nm.

—Thickness d0 of Image-Recording Layer—

The intensities of an ion ($AlO_2^-$) intrinsic to an aluminum support at individual depths are measured by the time-of-flight secondary ion mass spectrometry while etching the surface using the Ar gas cluster ion beam method, and a depth at which the intensity intersects with the intensity of the ion intrinsic to the hydrophilic polymer is specified as the depth d0 from the outermost layer (the thickness of the image-recording layer). The ion intensity at the depth d0 from the outermost layer is regarded as the ion intensity I0.

—Ratio d0/d1—

The ratio d0/d1 was computed from d0 and d1. d0/d1 is 2.0 or more, more preferably 2.5 or more, and still more preferably 3.0 to 33.0.

—Ratio I1/I0—

The ratio I1/I0 was computed from I0 and I1. I0/I1 is 1.5 or more, more preferably 1.8 or more, and still more preferably 2.0 or more.

The upper limit of I1/I0 is not particularly limited, but needs to be, for example, 100 or less.

In addition, it is preferable that the d0/d1 is 2.5 or more and the I1/I0 is 1.8 or more and it is more preferable that the d0/d1 is 3.0 to 33.0 and the I1/I0 is 2.0 or more.

[Water Contact Angle of Image-Recording Layer Surface]

The water contact angle of the image-recording layer surface is preferably 45° to 700, more preferably 50° to 650, and still more preferably 50° to 600.

In a case where the water contact angle is 45° or more, the ink-absorbing property is excellent, and, in a case where the water contact angle is 70° or less, the developability is excellent.

The water contact angle of the image-recording layer surface can be measured using a method in which water is brought into contact with the image-recording layer surface using a contact angle meter DMo-501 (manufactured by Kyowa Interface Science Co., Ltd.).

[Components Included in Image-Recording Layer]

The image-recording layer according to the present disclosure preferably contains an infrared absorber, a polymerizable compound, and a polymerization initiator and more preferably further includes a polymer particle.

Hereinafter, the components included in the image-recording layer other than the hydrophilic polymer will be described.

—Infrared Absorber—

The image-recording layer preferably contains an infrared absorber.

As the infrared absorber, a compound having a maximum absorption in a wavelength range of 750 nm to 1,400 nm is preferred.

As the infrared absorber that can be used in the present disclosure, an infrared absorber known as "photothermal conversion material" is included.

The photothermal conversion material is preferably a material that absorbs an infrared ray and converts the infrared ray to heat. The photothermal conversion material is not necessarily required to form an image using a high-temperature body, but it is also possible to make an image-formable element containing the photothermal conversion material form an image using a high-temperature body, for example, a thermal head or a thermal head array.

In addition, the infrared absorber preferably has a function of converting an absorbed infrared ray to heat and a function of migrating an electron and/or energy to a polymerization initiator described below by being excited by an infrared ray. As the infrared absorber that is used in the present disclosure, a dye or pigment having an absorption maximum at a wavelength of 760 nm to 1,200 nm is exemplified.

It is considered that, in a case where the image-recording layer includes an electron-donating polymerization initiator and an electron-receiving polymerization initiator described below, both the migration of an electron to the electron-receiving polymerization initiator by the infrared absorber being excited by exposure and the migration of an electron from an electron-donating radical initiator to the infrared absorber occur.

The photothermal conversion material may be a random material capable of absorbing an infrared ray and converting the infrared ray to heat. As a preferred material, a colorant and a pigment are exemplified. As a preferred pigment, for example, carbon black, heliogen green, nigrosine base, iron (III) oxide, manganese oxide, Prussian blue, and Paris blue are exemplified. The size of a pigment particle is not supposed to increase the thickness of a layer containing the pigment. Most preferably, the size of the particle is equal to or smaller than half the thickness of the layer.

The amount of the infrared absorber in the image-recording layer is preferably an amount in which the optical density of the image-recording layer reaches 0.05 or more at an image-forming wavelength and more preferably an amount in which the optical density reaches 0.5 to 3.

The photothermal conversion material is capable of including a colorant having an appropriate absorption spectrum and an appropriate solubility.

As the colorant, a colorant having a maximum absorption particularly in a wavelength range of 750 nm to 1,200 nm is preferred. Examples of a preferred colorant include colorants of the following classes: methine, polymethine, arylmethine, cyanine, hemicyanine, streptocyanin, squarylium, pyrylium, oxonol, naphthoquinone, anthraquinone, porphyrin, azo, croconium, triarylamine, thiazolium, indolium, oxazolium, indocyanine, indotricarbocyanine, oxatricarbocyanine, phthalocyanine, thiocyanin, thiatricarbocyanine, merocyanine, cryptocyanine, naphthalocyanine, polyaniline, polypyrrole, polythiophene, chalcogenopyrylarylidene, bis (chalcogenopyrrillo) polymethine, oxyindolizine, pyrazolineazo, and oxazine.

The infrared absorber is disclosed in a number of publications, for example, the specification of EP0823327A by Nagasaka et al., the specification of U.S. Pat. No. 4,973,572A (DeBoer), and the specification of U.S. Pat. No. 5,208,135A (Patel et al.). Additional examples of a useful infrared absorber include ADS-830A and ADS-1064 that can be procured from American Dye Source, Inc. (Baie D'Urfe, Quebec, Canada).

In addition, as the infrared absorber, a water-soluble photothermal conversion material is preferred.

The water-soluble photothermal conversion material preferably includes, for example, a cyanine colorant having one or more sulfate groups and/or sulfonate groups. An infrared-absorbing cyanine anion containing two to four sulfonate groups is reported in, for example, the specification of U.S. Pat. No. 5,107,063A (West et al.), the specification of U.S. Pat. No. 5,972,838A (Pearce et al.), the specification of U.S. Pat. No. 6,187,502B (Chapman et al.), and the specification of U.S. Pat. No. 5,330,884A (Fabricius et al.).

Among these, as the infrared absorber, cyanine colorants such as a cyanine compound, a hemicyanine compound, a streptocyanine compound, an indocyanine compound, an indotricarbocyanine compound, an oxatricarbocyanine compound, a phthalocyanine compound, a thiocyanine compound, a thiatricarbocyanine compound, a merocyanine compound, a cryptocyanine compound, and a naphthalocyanine compound, a squarylium colorant, a pyrylium salt, and a nickel thiolate complex are preferably exemplified, and cyanine colorants are more preferably exemplified.

—Polymerizable Compound—

The image-recording layer preferably contains a polymerizable compound.

As the polymerizable compound, an ethylenically unsaturated compound is preferably exemplified.

The ethylenically unsaturated compound may be any of a monofunctional compound and a polyfunctional compound, but is preferably a polyfunctional ethylenically unsaturated compound.

In addition, the polymerizable compound has a chemical form, for example, a monomer, a prepolymer, that is, a dimer, a trimer, or an oligomer, a polymer, or a mixture thereof.

As the polyfunctional ethylenically unsaturated compound, an unsaturated ester of alcohol is preferred, and an acrylate ester and a methacrylate ester of polyol are more preferred.

As the oligomer and/or the prepolymer, it is also possible to use, for example, urethane acrylate and methacrylate, epoxide acrylate and methacrylate, polyester acrylate and methacrylate, polyether acrylate and methacrylate, and an unsaturated polyester resin.

Among these, an acrylate compound and/or a methacrylate compound are preferred, and a polyfunctional methacrylate compound and/or a polyfunctional methacrylate compound are more preferred.

In addition, the polymerizable compound preferably has an urethane bond from the viewpoint of printing resistance.

As the polymerizable compound having an urethane bond, an urethane (meth)acrylate compound is preferably exemplified.

In addition, as the polymerizable compound, polymerizable compounds described in, for example, "Photoreactive Polymers: The Science and Technology of Resists" A.

Reiser, Wiley, New York, 1989, pp. 102 to 177; "Photopolymers: Radiation Curable Imaging Systems" B. M. Monroe; "Radiation Curing: Science and Technology" edited by S. P. Pappas, Plenum, New York, 1992, pp. 399 to 440; "Polymer imaging" A. B. Cohen and P. Walker; "Imaging Processes and Material" edited by J. M. Sturge et al., Van Nostrand Reinhold, New York, 1989, pp. 226 to 262.

—Polymerization Initiator—

The image-recording layer may contain a polymerization initiator.

The polymerization initiator may be a photopolymerization initiator or a thermopolymerization initiator, but a photopolymerization initiator is preferably included.

In addition, the polymerization initiator is preferably a radical polymerization initiator and more preferably a photoradical polymerization initiator.

The polymerization initiator is preferably a compound that generates a polymerization-initiating species by an ultraviolet ray, visible light ray, and/or infrared ray having a wavelength of 300 nm to 1,400 nm.

In the present disclosure, the polymerization initiator is not particularly limited, but a photoradical polymerization initiator described in JP2013-205569A is preferably used. Particularly, an onium salt is preferred.

As the onium salt, an iodonium salt and a sulfonium salt are exemplified. Hereinafter, specific examples of these compounds will be described, but the compounds are not limited thereto.

As examples of the iodonium salt, a diphenyl iodonium salt is preferred, a diphenyl iodonium salt particularly having an electron-donating group, for example, an alkyl group or an alkoxyl group as a substituent is preferred, and an asymmetric diphenyl iodonium salt is more preferred. Specific examples thereof include diphenyliodonium=hexafluorophosphate, 4-methoxyphenyl-4-(2-methylpropyl) phenyliodonium=hexafluorophosphate, 4-(2-methylpropyl) phenyl-p-tolyliodonium=hexafluorophosphate, 4-hexyloxyphenyl-2,4,6-trimethoxyphenyl iodonium=hexafluorophosphate, 4-hexyloxyphenyl-2,4-diethoxyphenyl iodonium=tetrafluoroborate, 4-octyloxyphenyl-2,4,6-trimethoxyphenyl iodonium=1-perfluorobutane sulfonate, 4-octyloxyphenyl-2,4,6-trimethoxyphenyliodonium=hexafluorophosphate, and bis(4-t-butylphenyl)iodonium=tetraphenyl borate.

As the sulfonium salt, a triarylsulfonium salt is preferred. As examples of the sulfonium salt, triphenylsulfonium=hexafluorophosphate, triphenylsulfonium=benzoyl formate, bis(4-chlorophenyl) phenylsulfonium=benzoyl formate, bis(4-chlorophenyl)-4-methylphenylsulfonium=tetrafluoroborate, tris(4-chlorophenyl)sulfonium=3,5-bis(methoxycarbonyl) benzenesulfonate, and tris(4-chlorophenyl) sulfonium=hexafluorophosphate are exemplified.

Among these, the iodonium salt is preferred. The onium salt is particularly preferably jointly used with the infrared absorber having a maximum absorption in a wavelength range of 750 nm to 1,400 nm.

In addition, the onium salt does not only function as the photopolymerization initiator but also functions as a thermopolymerization initiator (acting in a concerted manner particularly with the infrared absorber) in some cases.

In addition, the infrared absorber may also act as a sensitizer of the photopolymerization initiator.

In addition, the polymerization initiator preferably includes an electron-donating polymerization initiator and an electron-receiving polymerization initiator.

<<Electron-Donating Polymerization Initiator>>

The electron-donating polymerization initiator according to the present disclosure is not particularly limited, but an alkyl or arylate complex, an aminoacetic acid compound, a sulfur-containing compound, a tin-containing compound, or a sulfonate is preferred, an alkyl or arylate complex, an aminoacetic acid compound, or a sulfur-containing compound is more preferred, a borate compound, an N-phenyl glycine compound, or a thiol compound is still more preferred, and a borate compound is most preferred.

(Alkyl or Arylate Complex)

As an alkyl or arylate complex, a borate compound is preferred.

In the alkyl or arylate complex, it is considered that a carbon-hetero bond is oxidatively cleaved, and an active radical is generated.

[Borate Compound]

As the borate compound, a tetraaryl borate compound or a monoalkyltriaryl borate compound is preferred, a tetraaryl borate compound is more preferred from the viewpoint of the stability of the compound and a potential difference described below, and a tetraaryl borate compound having one or more aryl groups having an electron-attracting group is particularly preferred from the viewpoint of the potential difference described below.

As the electron-attracting group, a group having a positive σ value in Hammett equation is preferred, and a group having a σ value in Hammett equation of 0 to 1.2 is more preferred. The c value (a $\sigma_p$ value and a $\sigma_m$ value) in Hammett equation is described in detail in Hansch, C.; Leo, A.: Taft, R. W., Chem. Rev., 1991, 91, 165 to 195.

As the electron-attracting group, a halogen atom, a trifluoromethyl group, or a cyano group is preferred, and a fluorine atom, a chlorine atom, a trifluoromethyl group, or a cyano group is more preferred.

As a counter cation that the borate compound has, an alkali metal ion or a tetraalkyl ammonium ion is preferred, and a sodium ion, a potassium ion, or a tetrabutylammonium ion is more preferred.

Hereinafter, preferred examples of the borate compound will be exemplified, but the present disclosure is not limited thereto. Here, $X_c^+$ represents a monovalent cation and is preferably an alkali metal ion or a tetraalkyl ammonium ion and more preferably an alkali metal ion or a tetrabutylammonium ion. In addition, Bu represents an n-butyl group.

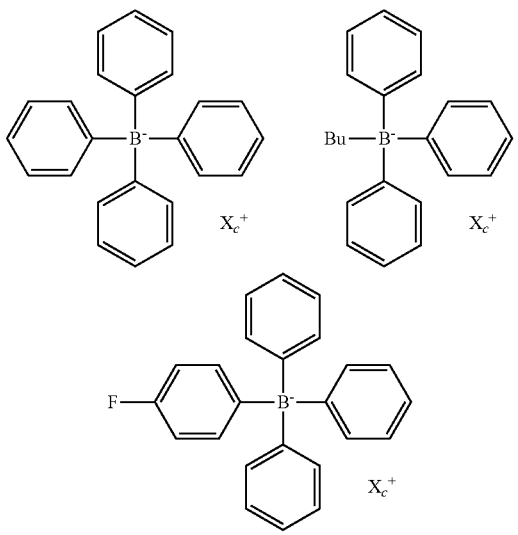

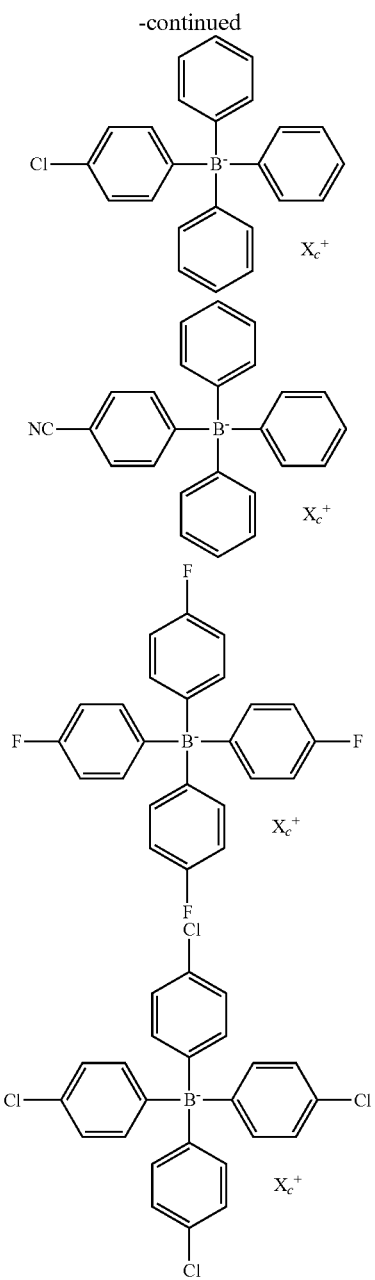

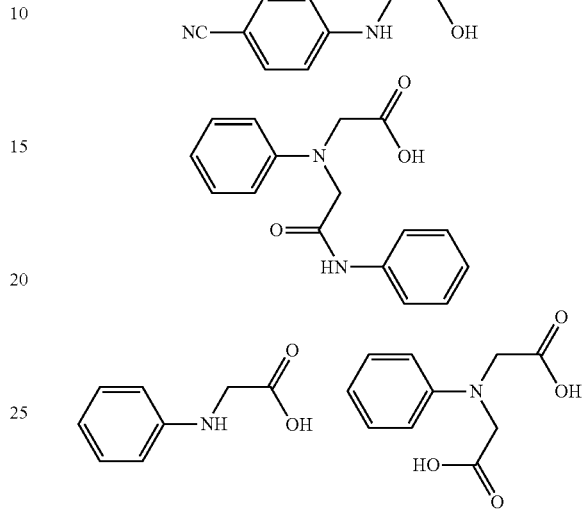

(Aminoacetic Acid Compound)

In the aminoacetic acid compound, it is considered that a C—X bond on carbon adjacent to nitrogen is cleaved by oxidation, and an active radical is generated. As X, a hydrogen atom, a carboxy group, a trimethylsilyl group, or a benzyl group is preferred. Specifically, N-phenylglycines (which may have a substituent in a phenyl group), N-phenyl iminodiacetic acid (which may have a substituent in a phenyl group), and the like are exemplified, and an N-phenyl glycine compound is preferred.

[N-Phenyl Glycine Compound]

As the N-phenyl glycine compound, N-phenyl glycine, an N-phenyl glycine alkyl ester compound, an N-phenyl glycine compound further having a substituent in a nitrogen atom to which a phenyl group bonds, and the like are exemplified.

The N-phenyl glycine compound preferably has a substituent in a phenyl group from the viewpoint of a potential difference described below. As a preferred substituent, the above-described electron-attracting group is exemplified.

Hereinafter, preferred examples of the N-phenyl glycine compound will be exemplified, but the present disclosure is not limited thereto.

(Sulfur-Containing Compound)

As the sulfur-containing compound, for example, a thiol compound which has a thiol group (—SH group) and generates a radical by the cleavage of the thiol group is exemplified.

Additionally, a sulfur-containing compound obtained by substituting a nitrogen atom in the aminoacetic acid compound with a sulfur atom is capable of generating an active radical by the same action as that of the aminoacetic acid compound.

As the sulfur-containing compound, a compound having a thiol group is preferred, from the viewpoint of the boiling point (difficulty in volatilization), a thiol compound having 7 or more carbon atoms is more preferred, a compound having a thiol group (mercapto group) on an aromatic ring (aromatic thiol compound) is still more preferred, and a compound having a 2-mercaptobenzoimidazole structure, a 3-mercapto-1,2,4-triazole structure, or a 2-mercaptobenzothiazole structure is particularly preferred.

A hydrogen atom bonding to a nitrogen atom at the first site in the 2-mercaptobenzoimidazole structure may be substituted, and, as a preferred substituent, an alkyl group and an aryl group are exemplified.

In addition, a benzene ring structure in the 2-mercaptobenzoimidazole structure may have a substituent, and, as a preferred substituent, an alkyl group, an alkoxy group, and a halogen atom are exemplified.

A hydrogen atom bonding to a nitrogen atom at the fourth site or a carbon atom on the fifth side in the 3-mercapto-1,2,4triazole structure may be substituted, and, as a preferred substituent, an alkyl group and an aryl group are exemplified.

A benzene ring structure in the 2-mercaptobenzoimidazole structure may have a substituent, and, as a preferred substituent, an alkyl group, an alkoxy group, and a halogen atom are exemplified.

Hereinafter, preferred examples of the sulfur-containing compound will be exemplified, but the present disclosure is not limited thereto.
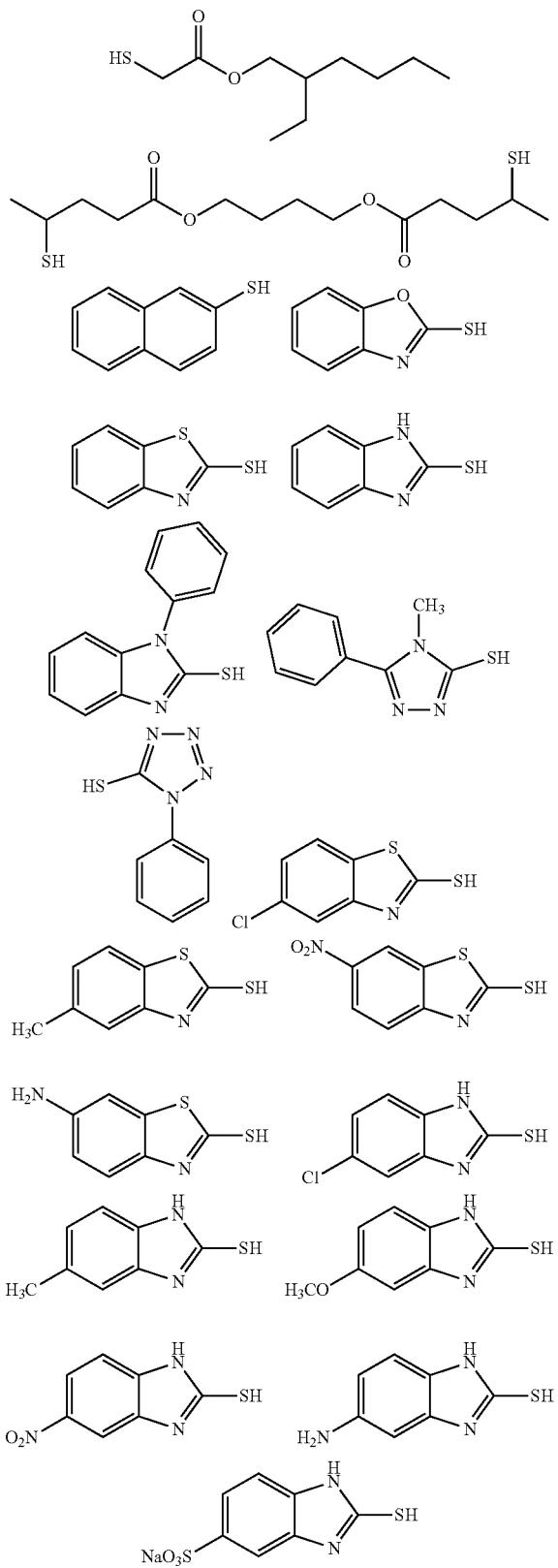
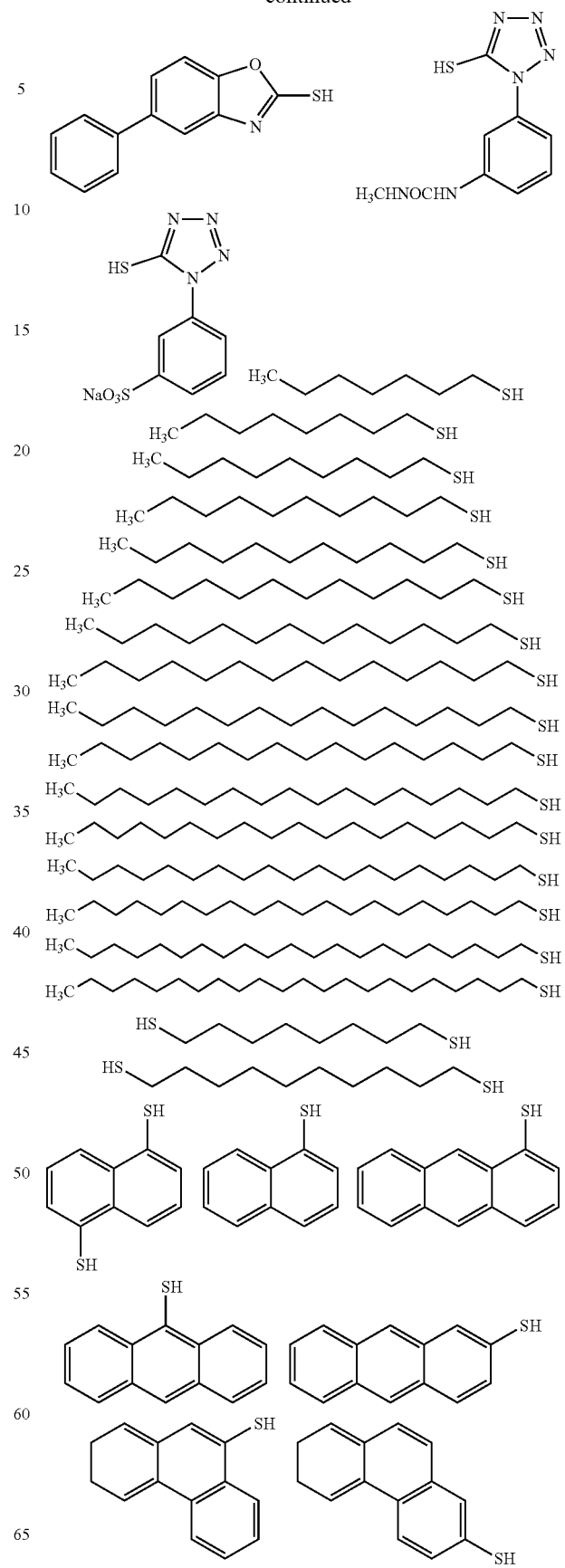

-continued

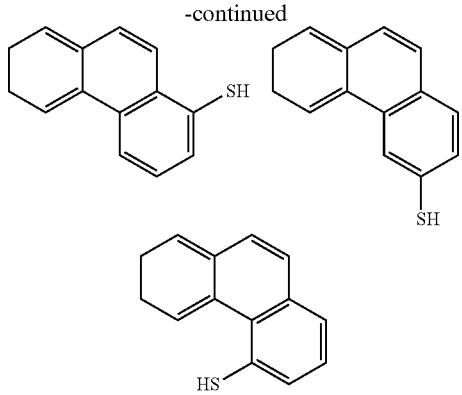

(Tin-Containing Compound)

The tin-containing compound is a compound obtained by substituting a nitrogen atom in the aminoacetic acid compound with a tin atom and is capable of generating an active radical by the same action.

(Sulfinates)

The sulfinate is a sulfinate compound such as sodium arylsulfinate and is capable of generating an active radical by oxidation.

(Content)

In the image-recording layer according to the present disclosure, the electron-donating polymerization initiator may be used singly or two or more electron-donating polymerization initiators may be jointly used.

In a case where the image-recording layer according to the present disclosure includes the electron-donating polymerization initiator, the content of the electron-donating polymerization initiator is preferably 0.01% by mass to 30% by mass, more preferably 0.05% by mass to 25% by mass, and still more preferably 0.1% by mass to 20% by mass of the total mass of the image-recording layer.

<<Electron-Receiving Polymerization Initiator>>

As the electron-receiving polymerization initiator, for example, (a) an organic halide, (b) a carbonyl compound, (c) an azo compound, (d) an organic peroxide, (e) a metallocene compound, (f) an azide compound, (g) a hexaarylbiimidazole compound, (h) a disulfone compound, (i) an oxime ester compound, and (j) an onium salt compound are exemplified.

As the organic halide (a), for example, a compound described in Paragraphs 0022 and 0023 of JP2008-195018A is preferred.

As the carbonyl compound (b), for example, a compound described in Paragraph 0024 of JP2008-195018A is preferred.

As the azo compound (c), for example, an azo compound described in JP1996-108621A (JP-H08-108621A) or the like is preferred.

As the organic peroxide (d), for example, a compound described in Paragraph 0025 of JP2008-195018A is preferred.

As the metallocene compound (e), for example, a compound described in Paragraph 0026 of JP2008-195018A is preferred.

As the azido compound (f), for example, a compound such as 2,6-bis(4-azidobenzylidene)-4-methylcyclohexanone is preferred.

As the hexaarylbiimidazole compound (g), for example, a compound described in Paragraph 0027 of JP2008-195018A is preferred.

As the disulfone compound (h), for example, a compound described in each of JP1986-166544A (JP-S61-166544A) and JP2002-328465A is preferred.

As the oxime ester compound (i), for example, a compound described in Paragraphs 0028 to 0030 of JP2008-195018A is preferred.

Among the electron-receiving polymerization initiators, from the viewpoint of a curing property, an oxime ester and an onium salt are more preferably exemplified, and an onium salt such as an iodonium salt, a sulfonium salt, and an azinium salts. In a case where the electron-receiving polymerization initiator is used in the lithographic printing plate precursor, an iodonium salt and a sulfonium salt are particularly preferred. Specific examples of the iodonium salt and the sulfonium salt will be described below, but the present disclosure is not limited thereto.

As examples of the iodonium salt, a diphenyl iodonium salt is preferred, a diphenyl iodonium salt having, particularly, an electron-donating group as a substituent, for example, an alkyl group or an alkoxy group as a substituent is preferred, and an asymmetric diphenyl iodonium salt is preferred. As specific examples, the specific examples of the iodonium salt described as the above-described polymerization initiator are exemplified.

As examples of the sulfonium salt, a triarylsulfonium salt is preferred, a triarylsulfonium salt having, particularly, an electron-attracting group as a substituent, for example, in which at least part of groups on an aromatic ring are substituted with a halogen atom is preferred, and a triarylsulfonium salt in which the total number of substituted halogen atoms on the aromatic ring is four or greater is more preferred. As specific examples, the specific examples of the sulfonium salt described as the above-described polymerization initiator are exemplified.

The electron-receiving polymerization initiator may be used singly or two or more electron-receiving polymerization initiators may be jointly used.

In a case where the image-recording layer includes the electron-receiving polymerization initiator, the content of the electron-receiving polymerization initiator is preferably 0.1% by mass to 50% by mass, more preferably 0.5% by mass to 30% by mass, and particularly preferably 0.8% by mass to 20% by mass of the total mass of the image-recording layer.

—Polymer Particle—

The image-recording layer may contain a polymer particle.

The polymer particle preferably includes one compound selected from the group consisting of a thermoplastic polymer particle, a thermally reactive polymer particle, a polymer particle having a polymerizable group, a microcapsule encapsulating a hydrophobic compound, and a micro gel (crosslinked polymer particle).

As the thermoplastic polymer particle, the thermally reactive polymer particle, the polymer particle having a polymerizable group, the microcapsule encapsulating a hydrophobic compound, and the micro gel, a compound described in Paragraphs 0172 to 0200 of WO2015/129504A is preferably used as a compound thereof.

Among these, the image-recording layer preferably includes the thermoplastic polymer particle or the micro gel and more preferably includes the thermoplastic polymer particle.

As the thermoplastic polymer particle, a polymer particle including a styrene copolymer is preferred, and a styrene-acrylonitrile copolymer is more preferably included.

<<Polymer Particle Including Styrene Copolymer>>

The image-recording layer preferably contains a polymer particle including a styrene copolymer.

The content of the polymer particle including a styrene copolymer is preferably 80% by mass to 100% by mass, more preferably 90% by mass to 100% by mass, and still more preferably 95% by mass to 100% by mass of the total mass of the polymer particle.

The styrene copolymer needs to be a copolymer having at least a monomer unit derived from styrene (a monomer unit shown below) and is preferably a copolymer having the monomer unit shown below in an amount of 1% by mass to 95% by mass of the entire copolymer, more preferably a copolymer having the monomer unit shown below in an amount of 2% by mass to 90% by mass of the entire copolymer, still more preferably a copolymer having the monomer unit shown below in an amount of 5% by mass to 60% by mass of the entire copolymer, and particularly preferably a copolymer having the monomer unit shown below in an amount of 5% by mass to 40% by mass of the entire copolymer.

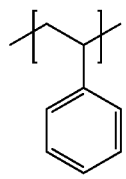

As a monomer other than styrene which is used for the production of the styrene copolymer, an ethylenic compound is preferred, and a compound selected from the group consisting of a (meth)acrylonitrile compound, a (meth)acrylate compound, a conjugated diene compound, and a styrene compound other than styrene is more preferred.

As the styrene copolymer, a styrene-(meth)acrylonitrile copolymer, a copolymer of styrene, (meth)acrylonitrile, and a (meth)acrylate compound, a styrene-butadiene-(meth)acrylonitrile copolymer, a copolymer of styrene and a (meth)acrylate compound, and the like are exemplified. Among these, a styrene-(meth)acrylonitrile copolymer or a copolymer of styrene, (meth)acrylonitrile, and a poly(ethylene glycol)monoalkyl ether (meth)acrylate compound are preferred, and a copolymer of styrene, (meth)acrylonitrile, and a poly(ethylene glycol)monoalkyl ether (meth)acrylate compound is particularly preferred.

As the (meth)acrylonitrile compound, (meth)acrylonitrile is exemplified, and acrylonitrile is preferred.

As the (meth)acrylate compound, poly(alkylene glycol) monoalkyl ether (meth)acrylate and alkyl (meth)acrylate are preferably exemplified, poly(alkylene glycol) monoalkyl ether (meth)acrylate is more preferably exemplified, and poly(ethylene glycol) monoalkyl ether (meth)acrylate is particularly preferably exemplified.

As the conjugated diene compound, butadiene and isoprene are exemplified.

As the styrene compound other than styrene, for example, α-methylstyrene, 4-methylstyrene, 4-hydroxystyrene, 4-acetoxystyrene, 4-acetylstyrene, styrenesulfonic acid, and the like are exemplified.

In addition, the styrene copolymer is preferably a copolymer obtained by copolymerizing macromonomers.

The macromonomer is a monomer having a polymer chain and a polymerizable group and a graft polymer can be conveniently formed by, for example, copolymerizing monofunctional macromonomers.

The weight average molecular weight of the macromonomer is preferably 300 to 10,000.

As the macromonomer, specifically, for example, polyethylene glycol monomethacrylate, polypropylene glycol methyl ether methacrylate, polyethylene glycol ethyl ether methacrylate, polyethylene glycol butyl ether methacrylate, polypropylene glycol hexyl ether methacrylate, polypropylene glycol octyl ether methacrylate, polyethylene glycol methyl ether acrylate, polyethylene glycol ethyl ether acrylate, polyethylene glycol phenyl ether acrylate, polypropylene glycol monoacrylate, polypropylene glycol monomethacrylate, polypropylene glycol methyl ether methacrylate, polypropylene glycol ethyl ether methacrylate, polypropylene glycol butyl ether methacrylate, polyethylene glycol/polypropylene glycol methyl ether methacrylate, poly(vinyl alcohol) monoacrylate, poly(vinyl alcohol) monomethacrylate, and a mixture thereof are preferably exemplified. Among these, a poly(alkylene glycol)alkyl ether (meth)acrylate compound is preferred, and a poly(ethylene glycol) alkyl ether (meth)acrylate copolymer is more preferred. In the case of the above-described aspect, the on-machine developability and the on-machine developability over time are superior.

The number of carbon atoms in an alkyl group in an alkyl ether structure of the poly(alkylene glycol)alkyl ether (meth) acrylate compound is preferably 1 to 10, more preferably 1 to 8, and still more preferably 1 to 4.

In addition, the weight average molecular weight of the poly(alkylene glycol)alkyl ether (meth)acrylate compound is preferably 300 to 10,000, more preferably 500 to 8,000, and still more preferably 1,000 to 5,000.

In the present disclosure, unless particularly otherwise described, the weight average molecular weight of a polymer component is a polystyrene-equivalent weight average molecular weight (Mw) measured by gel permeation chromatography (GPC) in the case of using tetrahydrofuran (THF) as a solvent.

As the poly(alkylene glycol)alkyl ether (meth)acrylate compound, methoxy polyethylene glycol (meth)acrylate, ethoxy polyethylene glycol (meth)acrylate, or isopropoxy polyethylene glycol (meth)acrylate is preferred, and methoxy polyethylene glycol (meth)acrylate is more preferred.

In addition, the styrene copolymer preferably has a polyalkyleneoxy chain and more preferably has a polyethyleneoxy chain.

Furthermore, the styrene copolymer is preferably a copolymer of styrene, (meth)acrylonitrile, and the poly(alkylene glycol)alkyl ether (meth)acrylate compound. In the case of the above-described aspect, the on-machine developability and the on-machine developability over time are superior.

As a monomer that forms the styrene copolymer, an alkyl (meth)acrylate compound is exemplified.

The alkyl (meth)acrylate compound is preferably an alkyl methacrylate compound from the viewpoint of the hardness of the polymer particle.

In addition, the number of carbon atoms in an alkyl group in the alkyl(meth) acrylate compound is preferably 1 to 10, more preferably 1 to 4, still more preferably 1 or 2, and particularly preferably 1.

As the alkyl(meth) acrylate compound, methyl methacrylate or ethyl methacrylate is preferred, and methyl methacrylate is more preferred.

In addition, as the monomer that forms the styrene copolymer, a glycidyl (meth)acrylate is also preferably exemplified.

As a monomer other than the above-described monomer which can be used for the production of the styrene copolymer, for example, acrylic acid, methacrylic acid, allyl methacrylate, hydroxyethyl methacrylate, 2-ethoxyethyl methacrylate, 3-methoxypropyl methacrylate, methacrylamide, vinyl acetate, vinyl butyrate, methyl vinyl ketone, butyl vinyl ketone, vinyl fluoride, vinyl chloride, vinyl bromide, maleic anhydride, maleimide, N-phenylmaleimide, N-cyclohexylmaleimide, N-benzylmaleimide, and the like are exemplified.

The content of a monomer unit derived from styrene in the styrene copolymer is preferably 1% by mass to 50% by mass, more preferably 2% by mass to 40% by mass, and still more preferably 5% by mass to 35% by mass of the total mass of the copolymer.

In a case where the styrene copolymer is a copolymer obtained by copolymerizing (meth)acrylonitrile, the content of a monomer unit derived from (meth)acrylonitrile in the styrene copolymer is preferably 5% by mass to 98% by mass, more preferably 10% by mass to 95% by mass, still more preferably 20% by mass to 95% by mass, and particularly preferably 55% by mass to 90% by mass of the total mass of the copolymer.

In a case where the styrene copolymer is a copolymer obtained by copolymerizing a poly(alkylene glycol)alkyl ether methacrylate compound, the content of a monomer unit derived from the poly(alkylene glycol)alkyl ether methacrylate compound in the styrene copolymer is preferably 1% by mass to 40% by mass, more preferably 3% by mass to 30% by mass, and still more preferably 5% by mass to 15% by mass of the total mass of the copolymer.

The weight average molecular weight of the styrene copolymer is preferably 3,000 to 100,000, more preferably 5,000 to 80,000, and still more preferably 10,000 to 60,000.

The number average particle diameter of the polymer particle is preferably 10 nm to 1,000 nm, more preferably 100 nm to 700 nm, still more preferably 100 nm to 300 nm, and particularly preferably 150 nm to 250 nm.

A method for manufacturing the polymer particle is not particularly limited, and it is possible to use a well-known method for manufacturing a polymer and a well-known method for manufacturing a polymer particle.

—Acid Color Former—

The image-recording layer according to the present disclosure preferably contains an acid color former.

The "acid color former" is a compound having a property of developing color by receiving an electron-receiving compound (for example, a proton such as an acid). The acid color former is preferably a colorless compound which has a partial skeleton such as lactone, lactam, sultone, spiropyran, an ester, or an amide and in which the partial skeleton rapidly ring-opens or cleavages in the case of coming into contact with the electron-receiving compound.

Examples of the above-described acid color former include phthalides such as 3,3-bis(4-dimethylaminophenyl)-6-dimethylaminophthalide (referred to as the crystal violet lactone), 3,3-bis(4-dimethylaminophenyl)phthalide, 3-(4-dimethylaminophenyl)-3-(4-diethylamino-2-methylphenyl)-6-dimethylaminophthalide, 3-(4-dimethylaminophenyl)-3-(1,2-dimethylindol-3-yl)phthalide, 3-(4-dimethylaminophenyl)-3-(2-methylindol-3-yl)phthalide, 3,3-bis(1,2-dimethylindol-3-yl)-5-dimethylaminophthalide, 3,3-bis(1,2-dimethylindol-3-yl)-6-dimethylaminophthalide, 3,3-bis(9-ethylcarbazol-3-yl)-6-dimethylaminophthalide, 3,3-bis(2-phenylindol-3-yl)-6-dimethylaminophthalide, 3-(4-dimethylaminophenyl)-3-(1-methylpyrrole-3-yl)-6-dimethylaminophthalide, 3,3-bis[1,1-bis(4-dimethylaminophenyl)ethylene-2-yl]-4,5,6,7-tetrachlorophthalide, 3,3-bis[1,1-bis(4-pyrrolidinophenyl)ethylene-2-yl]-4,5,6,7-tetrabromophthalide, 3,3-bis[1-(4-dimethylaminophenyl)-1-(4-methoxyphenyl)ethylene-2-yl]-4,5,6,7-tetrachloropht halide, 3,3-bis[1-(4-pyrrolidinophenyl)-1-(4-methoxyphenyl)ethylene-2-yl]-4,5,6,7-tetrachlorophthalide, 3-[1,1-di(1-ethyl-2-methylindol-3-yl)ethylene-2-yl]-3-(4-diethylaminophenyl)phthalide, 3-[1,1-di(1-ethyl-2-methylindol-3-yl) ethylene-2-yl]-3-(4-N-ethyl-N-phenylaminophenyl) phthalide, 3-(2-ethoxy-4-diethylaminophenyl)-3-(1-n-octyl-2-methylindol-3-yl)-phthalide, 3,3-bis(1-n-octyl-2-methylindol-3-yl)-phthalide, and 3-(2-methyl-4-diethylaminophenyl)-3-(1-n-octyl-2-methylindol-3-yl)-phthalide, fluoranthenes such as 4,4-bisdimethylaminobenzhydryl benzyl ether, N-halophenyl-leucoauramine, N-(2,4,5-trichlorophenyl)leucoauramine, rhodamine-B-anilinolactam, rhodamine-(4-nitroanilino) lactam, rhodamine-B-(4-chloroanilino) lactar, 3,7-bis(diethylamino)-10-benzoylphenoxazine, benzoyl leuco methylene blue, 4-nitrobenzoylmethylene blue, 3,6-dimethoxyfluoran, 3-dimethylamino-7-methoxyfluoran, 3-diethylamino-6-methoxyfluoran, 3-diethylamino-7-methoxyfluoran, 3-diethylamino-7-chlorofluoran, 3-diethylamino-6-methyl-7-chlorofluoran, 3-diethylamino-6,7-dimethylfluoran, 3-N-cyclohexyl-N-n-butylamino-7-methylfluoran, 3-diethylamino-7-dibenzylaminofluoran, 3-diethylamino-7-octylaminofluoran, 3-diethylamino-7-di-n-hexyl aminofluoran, 3-diethylamino-7-anilinofluoran, 3-diethylamino-7-(2'-fluorophenylamino)fluoran, 3-diethylamino-7-(2'-chlorophenylamino)fluoran, 3-diethylamino-7-(3'-chlorophenylamino)fluoran, 3-diethylamino-7-(2',3'-dichlorophenylamino)fluoran, 3-dethylamino-7-(3'-trifluoromethylphenylamino)fluorane, 3-di-n-butylamino-7-(2'-fluorophenylamino) fluoran, 3-di-n-butylamino-7-(2'-chlorophenylamino)fluoran, 3-N-isopentyl-N-ethylamino-7-(2'-chlorophenylamino)fluorane, 3-N-n-hexyl-N-ethylamino-7-(2'-chlorophenylamino) fluoran, 3-diethylamino-6-chloro-7-anilinofluoran, 3-di-n-butylamino-6-chloro-7-anilinofluoran, 3-dethylamino-6-methoxy-7-anilinofluoran, 3-di-n-butylamino-6-ethoxy-7-anilinofluoran, 3-pyrrolidino-6-methyl-7-anilinofluoran, 3-piperidino-6-methyl-7-anilinofluoran, 3-morpholino-6-methyl-7-anilinofluoran, 3-dimethylamino-6-methyl-7-anilinofluoran, 3-diethylamino-6-methyl-7-anilinofluoran, 3-di-n-butylamino-6-methyl-7-anilinofluoran, 3-di-n-pentylamino-6-methyl-7-anilinofluoran, 3-N-ethyl-N-methyl-amino-6-methyl-7-anilinofluoran, 3-N-n-propyl-N-methyl-amino-6-methyl-7-anilinofluoran, 3-N-n-propyl-N-ethylamino-6-methyl-7-anilinofluoran, 3-N-n-butyl-N-methylamino-6-methyl-7-anilinofluoran, 3-N-n-butyl-N-ethylamino-6-methyl-7-anilinofluoran, 3-N-isobutyl-N-ethylamino-6-methyl-7-anilinofluoran, 3-N-isobutyl-N-ethylamino-6-methyl-7-anilinofluoran, 3-N-isopentyl-N-methylamino-6-methyl-7-anilinofluoran, 3-N-n-hexyl-N-methylamino-6-methy-7-anilinofluoran, 3-N-cyclohexyl-N-ethylamino-6-methyl-7-anilinofluoran, 3-N-cyclohexyl-N-n-propylamino-6-methyl-7-anilinofluoran, 3-N-cyclohexyl-N-n-butylamino-6-methyl-7-anilinofluoran, 3-N-cyclohexyl-N-n-hexylamino-6-methyl-7-anilinofluoran, 3-N-cyclohexyl-N-n-octylamino-6-methyl-7-anilinofluoran, 3-N-(2'-methoxyethyl)-N-methylamino-6-methyl-7-anilinofluoran, 3-N-(2'-methoxyethyl)-N-ethylamino-6-methyl-7-anilinofluoran, 3-N-(2'-methoxyethyl)-N-isobutylamino-6-methyl-7-anilinofluoran, 3-N-(2'-ethoxyethyl)-N-methylamino-6-methyl-7-anilinofluoran, 3-N-(2'-ethoxyethyl)-N-ethylamino-6-methyl-7-anilinofluoran, 3-N-(3'-methoxypropyl)-N-methylamino-6-methyl-7-anilinofluoran, 3-N-(3'-methoxypropyl)-N-ethylamino-6-methyl-7-anilinofluoran, 3-N-(3'-ethoxypropyl)-N-ethylamino-6-methyl-7-anilinofluoran, 3-N-(3'-ethoxypropyl)-N-methylamino-6-methyl-7-anilinofluoran, 3-N-(2'-tetrahydrofurfuryl)-N-ethylamino-6-methyl-7-anilinofluoran, 3-N-(4'-methylphenyl)-N-ethylamino-6-methyl-7-anilinofluoran, 3-diethylamino-6-methyl-7-anilinofluran, 3-diethylamino-6-methyl-7-(3'-methylphenylamino)fluoran, 3-diethylamino-6-methyl-7-(2',6'-methylphenylamino)fluoran, 3-di-n-butylamino-6-methyl-7-(2',6'-methylphenylamino)fluoran, 3-di-n-butylamino-7-(2',6'-dimethylphenylamino)fluoran, 2,2-bis[4'-(3-N-cyclohexyl-N-methylamino-6-methylfluoran)-7-ylaminophenyl]propane, 3-[4'-(4-phenylaminophenyl)aminophenyl]amino-6-methyl-7-chlorofluoran, and 3-[4'-(dimethylaminophenyl)] amino-5,7-dimethylfluoran, phthalides such as 3-(2-methyl-4-diethylaminophenyl)-3-(1-ethyl-2-methylindol-3-yl)-4-azaphthalide, 3-(2-n-propoxycarbonylamino-4-di-n-propylaminophenyl)-3-(1-ethyl-2-methylindol-3-yl)-4-azaphthalide, 3-(2-methylamino-4-di-n-propylaminophenyl)-3-(1-ethyl-2-methylindol-3-yl)-4-azaphthalide, 3-(2-methyl-4-di n-hexylaminophenyl)-3-(1-n-octyl-2-methylindol-3-yl)-4,7-diazaphthalide, 3,3-bis(2-ethoxy-4-diethylaminophenyl)-4-azaphthalide, 3,3-bis(1-n-octyl-2-methylindol-3-yl)-4-azaphthalide, 3-(2-ethoxy-4-diethylaminophenyl)-3-(1-ethyl-2-methylindol-3-yl)-4-azaphthalide, 3-(2-ethoxy-4-diethylaminophenyl)-3-(1-octyl-2-methylindol-3-yl)-4 or 7-azaphthalide, 3-(2-ethoxy-4-diethylaminophenyl)-3-(1-ethyl-2-methylindol-3-yl)-4 or 7-azaphthalide, 3-(2-hexyloxy-4-diethylaminophenyl)-3-(1-ethyl-2-methylindol-3-yl)-4 or 7-azaphthalide, 3-(2-ethoxy-4-diethylaminophenyl)-3-(1-ethyl-2-phenylindol-3-yl)-4 or 7-azaphthalide, 3-(2-butoxy-4-diethylaminophenyl)-3-(1-ethyl-2-phenylindol-3-yl)-4 or 7-azaphthalide 3-methyl-spiro-dinaphthopyran, 3-ethyl-spiro-dinaphthopyran, 3-phenyl-spiro-dinaphthopyran, 3-benzyl-spiro-dinaphthopyran, 3-methylnaphtho-(3-methoxybenzo)spiropyran, 3-propyl-spiro-dibenzopyran-3,6-bis(dimethylamino)fluorene-9-spiro-3'-(6'-dimethylamino)phthalide, and 3,6-bis(diethylamino)fluorene-9-spiro-3'-(6'-dimethylamino)phthalide, furthermore, 2'-anilino-6'-(N-ethyl-N-isopentyl)amino-3'-methylspiro[isobenzofuran-1 (3H), 9'-(9H) xanthene]-3-one, 2'-anilino-6'-(N-ethyl-N-(4-methylphenyl))amino-3'-methylspiro[isobenzofuran-1 (3H), 9'-(9H) xanthene]-3-one, 3'-N,N-dibenzylamino-6'-N,N-diethylaminospiro[isobenzofuran-1(3H), 9'-(9H) xanthene]-3-one, 2'-(N-methyl-N-phenyl)amino-6'-(N-ethyl-N-(4-methylphenyl))aminospiro[isobenzofuran-1(3H), 9'-(9H) xanthene]-3-one, and the like.

The acid color former is preferably at least one compound selected from the group consisting of a spiropyran compound, a spirooxazine compound, a spirolactone compound, or a spirolactam compound.

The hue of the colorant after color development is preferably green, blue, or black from the viewpoint of visibility.

As the acid color former, it is also possible to use a commercially available product. For example, ETAC, RED 500, RED 520, CVL, S-205, BLACK 305, BLACK 400, BLACK 100, BLACK 500, H-7001, GREEN 300, NIR-BLACK 78, BLUE 220, H-3035, BLUE 203, ATP, H-1046, H-2114 (all manufactured by Fukui Yamada Chemical Co., Ltd.), ORANGE-DCF, Vemnnilion-DCF, PINK-DCF, RED-DCF, BLMB, CVL, GREEN-DCF, TH-107 (all manufactured by Hodogaya Chemical Co., Ltd.), ODB, ODB-2, ODB-4, ODB-250, ODB-Black XV, Blue-63, Blue-502, GN-169, GN-2, Green-118, Red-40, Red-8 (all manufactured by Yamamoto Chemicals Inc.), crystal violet lactone (manufactured by Tokyo Chemical Industry Co., Ltd.), and the like are exemplified. Among these commercially available products, ETAC, S-205, BLACK 305, BLACK 400, BLACK 100, BLACK 500, H-7001, GREEN 300, NIR-BLACK 78, H-3035, ATP, H-1046, H-2114, GREEN-DCF, Blue-63, GN-169, and crystal violet lactone are preferred since a color-developing characteristic in exposure to an infrared ray is favorable.

The acid color former may be used singly, or two or more acid color formers may be jointly used.

The content of the acid color former is preferably 0.1% by mass to 20% by mass, more preferably 1% by mass to 15% by mass, and still more preferably 2% by mass to 10% by mass of the total mass of the image-recording layer.

To the image-recording layer, it is possible to add other components described below.

(1) Low-Molecular-Weight Hydrophilic Compound

The image-recording layer may contain a low-molecular-weight hydrophilic compound in order to improve the on-machine developability while suppressing the degradation of the printing resistance.

As the low-molecular-weight hydrophilic compound, examples of water-soluble organic compounds include glycols such as ethylene glycol, diethylene glycol, triethylene glycol, propylene glycol, dipropylene glycol, and tripropylene glycol and ethers or ester derivative thereof, polyols such as glycerin, pentaerythritol, and tris(2-hydroxyethyl) isocyanurate, organic amines such as triethanolamine, diethanolamine, and monoethanolamine and salts thereof, organic sulfonic acids such as alkyl sulfonic acid, toluene-sulfonic acid, and benzenesulfonic acid and salts thereof, organic sulfamic acids such as alkyl sulfamate and salts thereof, organic sulfuric acids such as alkyl sulfates and alkyl ether sulfates and salts thereof, organic phosphonic acids such as phenylphosphonic acid and salts thereof, organic carboxylic acids such as tartaric acid, oxalic acid, citric acid, malic acid, lactic acid, gluconic acid, and amino acid and salts thereof, betaines, and the like.

Among these, at least one compound selected from polyols, organic sulfates, organic sulfonates, and betaines is preferred.

As specific compounds of the organic sulfonates, compounds described in Paragraphs 0026 to 0031 of JP2007-276454A and Paragraphs 0020 to 0047 of JP2009-154525A; and the like are exemplified. The salts may be a potassium salt or a lithium salt.

As the organic sulfonates, compounds described in Paragraphs 0034 to 0038 of JP2007-276454A are exemplified.

As the betaines, a compound in which the number of carbon atoms in a hydrocarbon substituent into a nitrogen atom is 1 to 5 is preferred, and specific examples thereof include trimethyl ammonium acetate, dimethyl propyl ammonium acetate, 3-hydroxy-4-trimethyl ammonio butyrate, 4-(1-pyridinio) butyrate, 1-hydroxyethyl-1-imidazolio acetate, trimethyl ammonium methanesulfonate, dimethyl propyl ammonium methanesulfonate, 3-trimethylammonio-1-propane sulfonate, 3-(1-pyridinio)-1-propane sulfonate, and the like.

The low-molecular-weight hydrophilic compound has a small structure in a hydrophobic portion, and thus there is no case where dampening water permeates an exposed portion (image area) in the image-recording layer and degrades the hydrophobicity or membrane hardness of the image area, and it is possible to favorably maintain the ink-receiving property or printing resistance of the image-recording layer.

The amount of the low-molecular-weight hydrophilic compound added is preferably 0.5% by mass to 20% by mass, more preferably 1% by mass to 15% by mass, and still more preferably 2% by mass to 10% by mass of the total mass of the image-recording layer. In this range, favorable on-machine developability and favorable printing resistance are obtained.

The low-molecular-weight hydrophilic compound may be used singly or two or more low-molecular-weight hydrophilic compounds may be used in a mixture form.

(2) Sensitization Agent

In the image-recording layer, a sensitization agent such as a phosphonium compound, a nitrogen-containing low-molecular-weight compound, or an ammonium group-containing polymer can be used in order to improve the ink-absorbing property. Particularly, in a case where an inorganic lamellar compound is contained in a protective layer, the above-described compounds function as a surface-coating agent of the inorganic lamellar compound and has an action of preventing the degradation of the ink-absorbing property in the middle of printing by the inorganic lamellar compound.

The phosphonium compound, the nitrogen-containing low-molecular-weight compound, and the ammonium group-containing polymer are specifically described in Paragraphs 0184 to 0190 of JP2014-104631A.

The content of the sensitization agent is preferably 0.01% by mass to 30.0% by mass, more preferably 0.1% by mass to 15.0% by mass, and still more preferably 1% by mass to 10% by mass of the total mass in the image-recording layer.

(3) Other Components

The image-recording layer is capable of further containing, as other components, a surfactant, a coloring agent, a print-out agent, a polymerization inhibitor, a higher fatty acid derivative, a plasticizer, an inorganic particle, an inorganic lamellar compound, a co-sensitizer, a chain transfer agent, or the like. Specifically, it is possible to use compounds and amounts added described in Paragraphs 0114 to 0159 of JP2008-284817A, Paragraphs 0023 to 0027 of JP2006-091479A, and Paragraph 0060 of the specification of US2008/0311520A.

[Second Aspect of Image-Recording Layer]

In addition, the image-recording layer may be an image-recording layer containing an infrared absorber and a thermoplastic polymer particle (also referred to as the second aspect of the image-recording layer). Hereinafter, constituent components of the second aspect of the image-recording layer will be described.

<<Infrared Absorber>>

The infrared absorber that is included in the second aspect of the image-recording layer is preferably a dye or pigment having an absorption maximum in a wavelength range of 760 nm to 1,200 nm. A dye is more preferred.

As the dye, it is possible to use a commercially available dye and a well-known dye described in publications (for example, "Dye Handbooks" edited by the Society of Synthetic Organic Chemistry, Japan and published on 1970, "Infrared-absorbing colorant" in pp. 45 to 51 of "Chemical Industry", May 1986, and Sections 2 and 3 in Chapter 2 of "Development and Market Trend of Functional Dyes in 1990s" (published by CMC Publishing Co., Ltd., on 1990)) or patents. Specifically, an infrared-absorbing dye such as an azo dye, a metal complex azo dye, a pyrazolone azo dye, an anthraquinone dye, a phthalocyanine dye, a carbonium dye, a quinoneimine dye, a polymethine dye, or a cyanine dye is preferred.

Among these dyes, a dye that is particularly preferably added to the second aspect of the image-recording layer is an infrared-absorbing dye having a water-soluble group.

Hereinafter, specific examples of the infrared-absorbing dye will be shown, but the infrared-absorbing dye is not limited thereto.

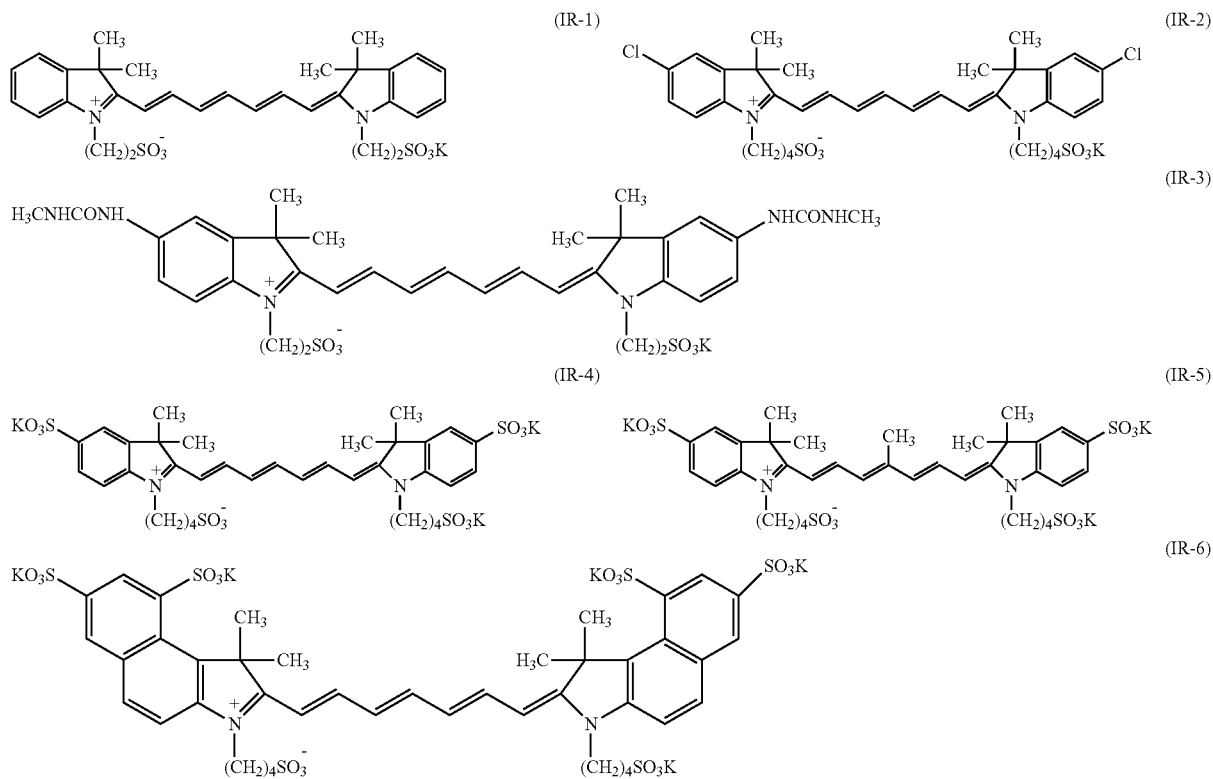

-continued

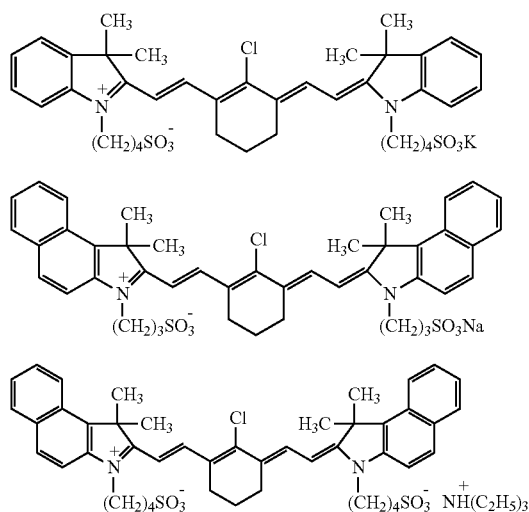

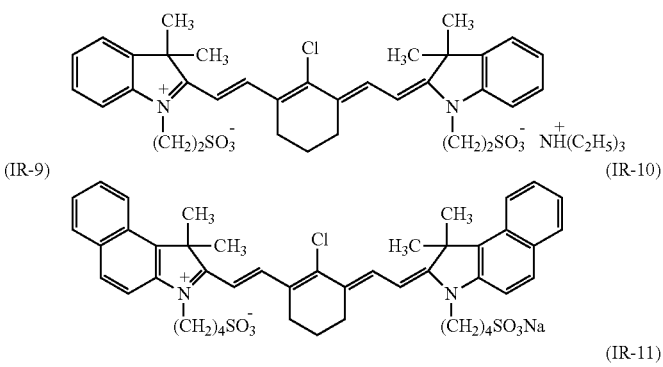

As the pigment, it is possible to use a commercially available pigment and a pigment described in Color Index (C. I.) Handbook, "Advanced Pigment Handbooks" (edited by Japan Association of Pigment Technology and published on 1977), "Advanced Pigment Application Technology" (published by CMC Publishing Co., Ltd., on 1986), and "Printing Ink Technology" (published by CMC Publishing Co., Ltd., on 1984).

The particle diameter of the pigment is preferably 0.01 m to 1 m and more preferably 0.01 m to 0.5 µm. As a method for dispersing the pigment, it is possible to use a well-known dispersion technique that is used for the manufacturing of ink, the manufacturing of a toner, or the like. The detail is described in "Advanced Pigment Application Technology" (published by CMC Publishing Co., Ltd., on 1986).

The content of the infrared absorber is preferably 0.1% by mass to 30% by mass, more preferably 0.25% by mass to 25% by mass, and particularly preferably 0.5% by mass to 20% by mass of the total mass of the image-recording layer. In the above-described range, a favorable sensitivity can be obtained without impairing the membrane hardness of the image-recording layer.

<<Thermoplastic Polymer Particle>>

The glass transition temperature (Tg) of the thermoplastic polymer particle is preferably 60° C. to 250° C. Tg of the thermoplastic polymer particle is more preferably 70° C. to 140° C. and still more preferably 80° C. to 120° C.

As the thermoplastic polymer particle having Tg of 60° C. or higher, for example, thermoplastic polymer particles described in Research Disclosure No. 33303 (January 1992), JP1997-123387A (JP-H9-123387A), JP1997-131850A (JP-H9-131850A), JP1997-171249A (JP-H9-171249A), JP1997-171250A (JP-H9-171250A), EP931647A, and the like can be exemplified as preferred thermoplastic polymer particles.

Specifically, homopolymers or copolymers constituted of a monomer such as ethylene, styrene, vinyl chloride, methyl acrylate, ethyl acrylate, methyl methacrylate, ethyl methacrylate, vinylidene chloride, acrylonitrile, or vinyl carbazole, mixtures thereof, and the like can be exemplified. As preferred thermoplastic polymer particle, copolymer including polystyrene, styrene, and acrylonitrile, polymethyl methacrylate, and the like are exemplified.

From the viewpoint of the resolution and the temporal stability, the average particle diameter of the thermoplastic polymer particle is preferably 0.005 µm to 2.0 Vim. This value is also applied as the average particle diameter in a case where two or more kinds of thermoplastic polymer particles are mixed together. The average particle diameter is preferably 0.01 m to 1.5 m and particularly preferably 0.05 m to 1.0 m. In a case where two or more kinds of thermoplastic polymer particles are mixed together, the polydispersity is preferably 0.2 or more. The average particle diameter and the polydispersity are computed using a laser light scattering method.

Two or more kinds of the thermoplastic polymer particles may be mixed together and used. Specifically, the use of at least two kinds of thermoplastic polymer particles having different particle sizes or the use of at least two kinds of thermoplastic polymer particles having different Tg's is exemplified. The use of a mixture of two or more kinds of thermoplastic polymer particles further improves the film-curing property of the image area and further improves the printing resistance in the case of producing a lithographic printing plate.

For example, in the case of using thermoplastic polymer particles having the same particle size, a certain number of pores are present between the thermoplastic polymer particles, and there is a case where a desired curing property of the film cannot be obtained even in the case of melting and solidifying the thermoplastic polymer particles by image exposure. In contrast, in the case of using thermoplastic polymer particles having different particle sizes, it is possible to decrease the porosity present between the thermoplastic polymer particles, and, consequently, the film-curing property of the image area after image exposure can be improved.

In addition, in the case of using thermoplastic polymer particles having the same Tg, when an increase in the temperature of the image-recording layer by image exposure is not sufficient, there is a case where the thermoplastic polymer particles are not sufficiently melted and solidified and a desired curing property of the film cannot be obtained.

In contrast, in the case of using thermoplastic polymer particles having different Tg's, it is possible to improve the film-curing property of the image area even in a case where an increase in the temperature of the image-recording layer by image exposure is not sufficient.

In the case of using a mixture of two or more kinds of thermoplastic polymer particles having different Tg's, Tg of at least one kind of the thermoplastic polymer particle is preferably 60° C. or higher. At this time, the difference in Tg is preferably 10° C. or more and more preferably 20° C. or more. In addition, the content of the thermoplastic polymer particle having Tg of 60° C. or higher is preferably 70% by mass or more of all of the thermoplastic polymer particles.

The thermoplastic polymer particle may have a crosslinking group. In the case of using the thermoplastic polymer particle having a crosslinking group, heat that is generated in the image-exposed portion causes the crosslinking group to thermally react and form a crosslink between polymers, which improves the membrane hardness of the image area and makes the printing resistance superior. The crosslinking group may be a group causing any reaction as long as a chemical bond is formed, and, for example, an ethylenically unsaturated group causing a polymerization reaction (for example, an acryloyl group, a methacryloyl group, a vinyl group, an allyl group, or the like), an isocyanate group causing an addition reaction or a blocked body thereof and a group having an active hydrogen atom that is a reaction partner of the isocyanate group or the blocked body thereof (for example, an amino group, a hydroxy group, a carboxyl group, or the like), similarly, an epoxy group causing an addition reaction and an amino group, a carboxyl group, or a hydroxy group that is a reaction partner of the epoxy group, a carboxyl group and a hydroxy group or an amino group which cause a condensation reaction, an acid anhydride and an amino group or a hydroxy group which causes a ring-opening addition reaction, and the like can be exemplified.

As the thermoplastic polymer particle having the crosslinking group, specifically, thermoplastic polymer particles having a crosslinking group such as an acryloyl group, a methacryloyl group, a vinyl group, an allyl group, an epoxy group, an amino group, a hydroxy group, a carboxyl group, an isocyanate group, an acid anhydride, or a group protecting the above-described group can be exemplified. The crosslinking group may be introduced to the polymer during the polymerization of the polymer particle or using a polymer reaction after the polymerization of the polymer particle.

In the case of introducing the crosslinking group during the polymerization of the polymer particle, a monomer having the crosslinking group is preferably emulsion-polymerized or suspension-polymerized. As specific examples of the monomer having the crosslinking group, allyl methacrylate, allyl acrylate, vinyl methacrylate, vinyl acrylate, glycidyl methacrylate, glycidyl acrylate, blocked isocyanate by 2-isocyanatoethyl methacrylate or an alcohol thereof, blocked isocyanate by 2-isocyanate ethyl acrylate or an alcohol thereof, 2-aminoethyl methacrylate, 2-aminoethyl acrylate, 2-hydroxyethyl methacrylate, 2-hydroxyethyl acrylate, acrylic acid, methacrylic acid, maleic anhydride, bifunctional acrylate, bifunctional methacrylate, and the like can be exemplified.

As the polymer reaction that is used in the case of introducing the crosslinking group after the polymerization of the polymer particle, for example, a polymer reaction described in WO096/034316A can be exemplified.

The thermoplastic polymer particles may react with each other through the crosslinking group or the thermoplastic polymer particle may react with a polymer compound or low-molecular-weight compound added to the image-recording layer.

The content of the thermoplastic polymer particle is preferably 50% by mass to 95% by mass, more preferably 60% by mass to 90% by mass, and particularly preferably 70% by mass to 85% by mass of the total mass of the image-recording layer.

<<Other Components>>

The second aspect of the image-recording layer may further contain other components as necessary.

As the other components, a surfactant having a polyoxyalkylene group or a hydroxy group is preferably exemplified.

As the surfactant having a polyoxyalkylene group (hereinafter, also expressed as "POA group") or a hydroxy group, a surfactant having a POA group or a hydroxy group can be appropriately used, but an anionic surfactant or a nonionic surfactant is preferred. Between an anionic surfactant or nonionic surfactant having a POA group or a hydroxy group, an anionic surfactant or nonionic surfactant having a POA group is preferred.

As the POA group, a polyoxyethylene group, a polyoxypropylene group, a polyoxybutylene group, or the like is preferred, and a polyoxyethylene group is particularly preferred.

The average degree of polymerization of an oxyalkylene group is preferably 2 to 50 and more preferably 2 to 20.

The number of the hydroxy groups is preferably 1 to 10 and more preferably 2 to 8. Here, a terminal hydroxy group in the oxyalkylene group is not counted in the number of the hydroxy groups.

The anionic surfactant having a POA group is not particularly limited, and polyoxyalkylene alkyl ether carboxylates, polyoxyalkylene alkyl sulfosuccinates, polyoxyalkylene alkyl ether sulfate esters, alkylphenoxy polyoxyalkylene propyl sulfonates, polyoxyalkylene alkyl sulfophenyl ethers, polyoxyalkylene aryl ethers sulfuric acid ester salts, polyoxyalkylene polycyclic phenyl ether sulfuric acid ester salts, polyoxyalkylene styryl phenyl ether sulfuric acid ester salts, polyoxyalkylene alkyl ether phosphoric acid ester salts, polyoxyalkylene alkyl phenyl ether phosphoric acid ester salts, polyoxyalkylene perfluoroalkyl ether phosphate esters, and the like are exemplified.

The anionic surfactant having a hydroxy group is not particularly limited, and hydroxycarboxylates, hydroxyalkyl ether carboxylates, hydroxyalkane sulfonates, fatty acid monoglyceride sulfates, fatty acid monoglyceride phosphoric acid ester salts, and the like are exemplified.

The content of the surfactant having a POA group or a hydroxy group is preferably 0.05% by mass to 15% by mass and more preferably 0.1% by mass to 10% by mass of the total mass of the image-recording layer.

Hereinafter, specific examples of the surfactant having a POA group or a hydroxy group will be exemplified, but the surfactant is not limited thereto. The following surfactant A-12 is a trade name of ZONYL FSP and can be procured from Dupont. In addition, the following surfactant N-11 is a trade name of ZONYL FSO 100 and can be procured from Dupont. m and n in A-12 each independently represent an integer of 1 or more.

A-1

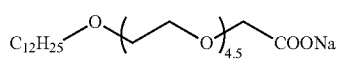

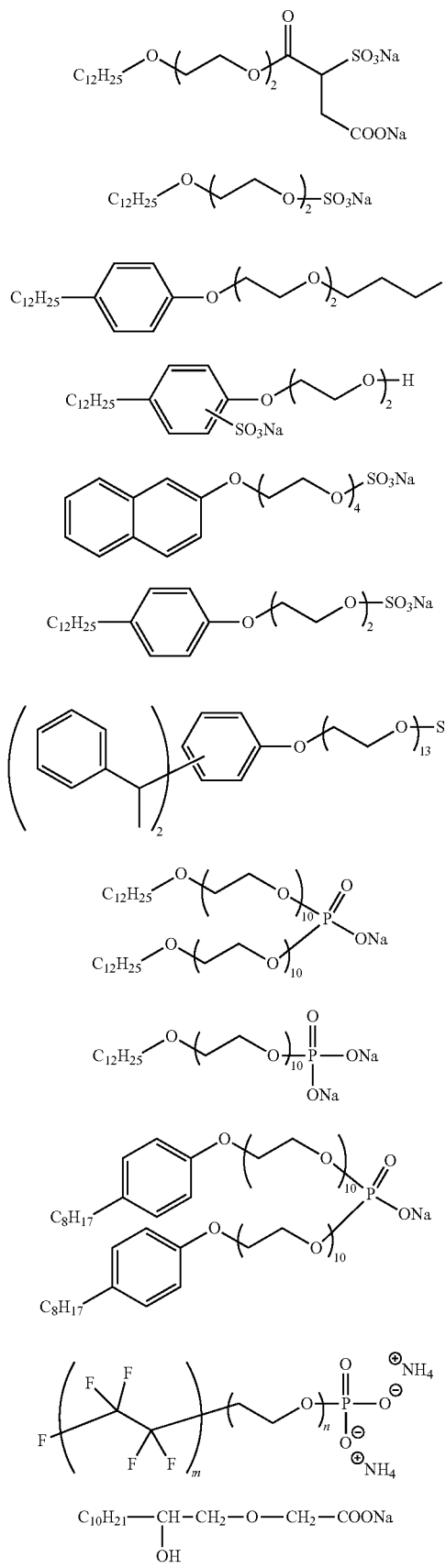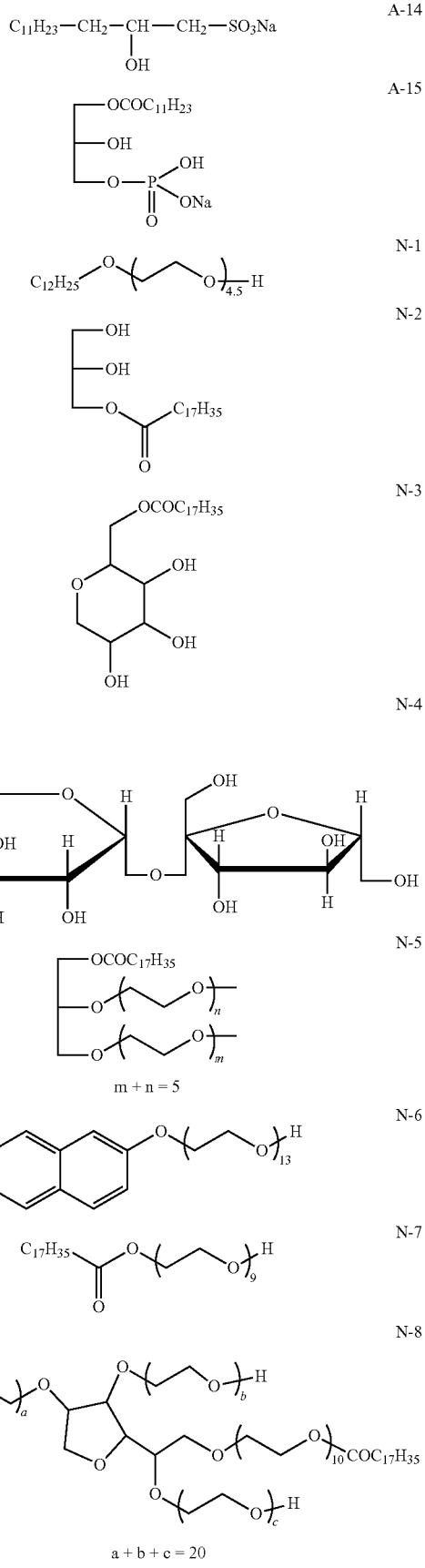

N-9

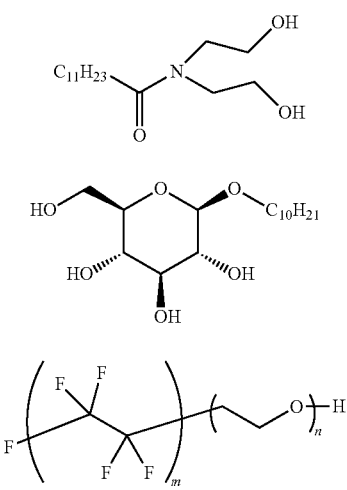

N-10

N-11

The image-recording layer may contain an anionic surfactant having neither a polyoxyalkylene group nor a hydroxy group for the purpose of ensuring the uniformity of the coating of the image-recording layer.

The anionic surfactant is not particularly limited as long as the above-described purpose is achieved. Particularly, alkylbenzenesulfonic acid or a salt thereof, alkylnaphthalenesulfonic acid or a salt thereof, (di)alkyldiphenyl ether (di)sulfonic acid or a salt thereof, and alkylsulfuric acid ester salt are preferred.

The amount of the anionic surfactant having neither a polyoxyalkylene group nor a hydroxy group added is preferably 1% by mass to 50% by mass and more preferably 1% by mass to 30% by mass of the total mass of the surfactant having a polyoxyalkylene group or a hydroxy group.

Hereinafter, specific examples of the anionic surfactant not having a polyoxyalkylene group and a hydroxy group will be exemplified, but the present disclosure is not limited thereto.

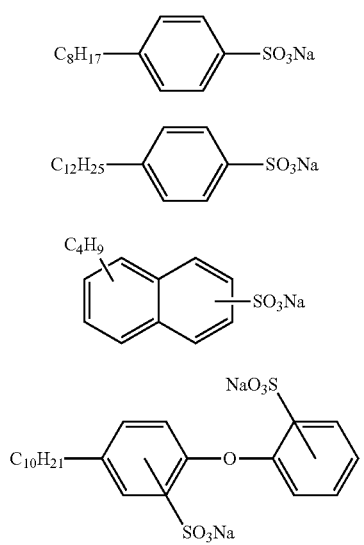

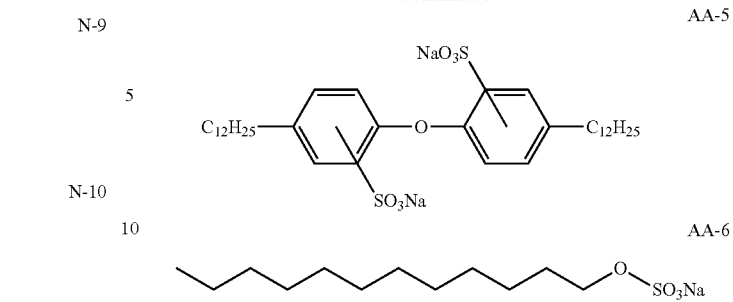

In addition, for the purpose of ensuring the uniformity of the coating of the image-recording layer, a nonionic surfactant having neither a polyoxyalkylene group nor a hydroxy group or a fluorine-based surfactant may be used. For example, a fluorine-based surfactant described in JP1987-170950A (JP-S62-170950A) is preferably used.

The image-recording layer is capable of containing a hydrophilic resin. As the hydrophilic resin, for example, a resin having a hydrophilic group such as a hydroxy group, a hydroxyethyl group, a hydroxypropyl group, an amino group, an aminoethyl group, an aminopropyl group, a carboxy group, a carboxylate group, a sulfo group, a sulfonate group, or a phosphate group is preferred.

As specific examples of the hydrophilic resin, gum arabic, casein, gelatin, a starch derivative, carboxymethylcellulose and a sodium salt thereof, cellulose acetate, sodium alginate, vinyl acetate-maleic acid copolymers, styrene-maleic acid copolymers, polyacrylic acids and salts thereof, polymethacrylic acids and salts thereof, a homopolymer and a copolymer of hydroxyethyl methacrylate, a homopolymer and a copolymer of hydroxyethyl acrylate, a homopolymer and a copolymer of hydroxypropyl methacrylate, a homopolymer and a copolymer of hydroxypropyl acrylate, a homopolymer and a copolymer of hydroxybutyl methacrylate, a homopolymer and a copolymer of hydroxybutyl acrylate, polyethylene glycols, hydroxy propylene polymers, polyvinyl alcohols, hydrolyzed polyvinyl acetate having a hydrolysis degree of preferably at least 60% and more preferably at least 80%, polyvinyl formal, polyvinyl butyral, polyvinyl pyrrolidone, a homopolymer and a copolymer of acrylamide, a homopolymer and a copolymer of methacrylamide, a homopolymer and a copolymer of N-methylolacrylamide, and the like can be exemplified.

The weight average molecular weight of the hydrophilic resin is preferably 2,000 or more from the viewpoint of obtaining a sufficient membrane hardness and sufficient printing resistance.

The content of the hydrophilic resin is preferably 0.5% by mass to 50% by mass and more preferably 1% by mass to 30% by mass of the total mass of the image-recording layer.

The image-recording layer may contain an inorganic particle. As the inorganic particle, silica, alumina, magnesium oxide, titanium oxide, magnesium carbonate, calcium alginate, mixtures thereof, and the like are exemplified as preferred examples. The inorganic particle can be used for the purpose of the strengthening of the film or the like.

The average particle diameter of the inorganic particle is preferably 5 nm to 10 nm and more preferably 10 nm to 1 μm. In this range, the inorganic particle is stably dispersed together with the thermoplastic polymer particle, the membrane hardness of the image-recording layer is sufficiently maintained, and it is possible to form a non-image area that does not easily allow the generation of printing contamination and has excellent hydrophilicity.

The inorganic particle can be easily procured as a commercially available product such as a colloidal silica dispersion.

The content of the inorganic particle is preferably 1.0% by mass to 70% by mass and more preferably 5.0% by mass to 50% by mass of the total mass of the image-recording layer.

To the image-recording layer, it is possible to add a plasticizer in order to impart the flexibility or the like of a coated film. As the plasticizer, for example, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, and the like are exemplified.

The content of the plasticizer is preferably 0.1% by mass to 50% by mass and more preferably 1% by mass to 30% by mass of the total mass of the image-recording layer.

In a case where a polymer particle having a thermally reactive functional group (crosslinking group) is used in the image-recording layer, it is possible to add a compound that initiates or accelerates the reaction of the thermally reactive functional group (crosslinking group) as necessary. As the compound that initiates or accelerates the reaction of the thermally reactive functional group, a compound that generates a radical or a cation by heat can be exemplified. For example, a lophine dimer, a trihalomethyl compound, a peroxide, an azo compound, a diazonium salt, an onium salt including a diphenyliodonium salt, acyl phosphine, imide sulfonate, and the like are exemplified. The amount of the above-described compound added is preferably 1% by mass to 20% by mass and more preferably 1% by mass to 10% by mass of the total mass of the image-recording layer. In this range, an effect for initiating or accelerating a favorable reaction without impairing on-machine developability can be obtained.

<<Formation of Second Aspect of Image-Recording Layer>>

The second aspect of the image-recording layer is formed by dissolving or dispersing the respective necessary components described above in an appropriate solvent to prepare a coating fluid and applying this coating fluid onto the support directly or through an undercoating layer. As the solvent, water or a solvent mixture of water and an organic solvent is used, and a solvent mixture of water and an organic solvent is preferably used from the viewpoint of making the shape property after application favorable. The amount of the organic solvent varies depending on the kind of the organic solvent and thus cannot be generally specified, but is preferably 5% by volume to 50% by volume in the solvent mixture. However, the organic solvent needs to be used in an amount in which the thermoplastic polymer particle does not agglomerate. The concentration of the solid content of the coating fluid for the image-recording layer is preferably 1% by mass to 50% by mass.

The organic solvent that is used as the solvent in the coating fluid is preferably an organic solvent that is soluble in water. Specifically, an alcohol solvent such as methanol, ethanol, propanol, isopropanol, or 1-methoxy-2-propanol, a ketone solvent such as acetone or methyl ethyl ketone, a glycol ether solvent such as ethylene glycol dimethyl ether, γ-butyrolactone, N,N-dimethylformamide, N,N-dimethylacetamide, tetrahydrofuran, dimethyl sulfoxide, and the like are exemplified. Particularly, an organic solvent having a boiling point of 120° C. or lower and a solubility in water (the amount of the organic solvent dissolved in 100 g of water) of 10 g or more is preferred, and an organic solvent having a solubility in water of 20 g or more is more preferred.

As a method for applying the coating fluid for the image-recording layer, a variety of methods can be used. For example, bar coater coating, rotary coating, spray coating, curtain coating, dip coating, air knife coating, blade coating, roll coating, and the like are exemplified. The coating amount (solid content) of the image-recording layer on the support obtained after application and drying varies depending on uses, but is preferably 0.5 g/m² to 5.0 g/m² and more preferably 0.5 g/m² to 2.0 g/m².

<Support>

The support in the lithographic printing plate precursor according to the embodiment of the present disclosure can be appropriately selected from well-known supports for a lithographic printing plate precursor and used.

As the support, a support having a hydrophilic surface is preferred.

As the support, an aluminum plate which is roughened and anodized using a well-known method is preferred.

On the aluminum plate, as necessary, enlargement processes or sealing processes of micropores in anode oxide films described in JP2001-253181A and JP2001-322365A, surface hydrophilization processes using alkali metal silicate as described in the specifications of US2,714,066A, US3,181,461A, US3,280,734A, and US3,902,734A, and surface hydrophilization processes using polyvinyl phosphonic acid or the like as described in the specifications of US3,276,868A, US4,153,461A, and US4,689,272A may be appropriately selected and carried out.

In the support, the center line average roughness is preferably in a range of 0.10 µm to 1.2 µm.

The support may have, as necessary, a backcoating layer including an organic polymer compound described in JP1993-045885A (JP-H05-045885A) or an alkoxy compound of silicon described in JP1994-035174A (JP-H06-035174A) on the surface opposite to the image-recording layer.

[Undercoating Layer]

The lithographic printing plate precursor according to the embodiment of the present disclosure preferably has an undercoating layer (also referred to as the interlayer in some cases) between the image-recording layer and the support. The undercoating layer strengthens adhesiveness between the support and the image-recording layer in an exposed portion and facilitates peeling the support and the image-recording layer in a non-exposed portion, and thus the undercoating layer contributes to improving developability without impairing printing resistance. In addition, in the case of exposure using an infrared laser, the undercoating layer functions as an adiabatic layer and thus has an effect of preventing the sensitivity from being degraded due to the diffusion of heat generated by exposure in the support.

Examples of a compound that can be used for the undercoating layer include a polymer having an adsorbent group that can be adsorbed to the surface of the support and a hydrophilic group. In order to improve adhesiveness to the image-recording layer, a polymer having an adsorbent group and a hydrophilic group and further having a crosslinking group is preferred. The compound that can be used for the undercoating layer may be a low-molecular-weight compound or a polymer. Two or more compounds that can be used for the undercoating layer may be used in a mixture form as necessary.

In a case where the compound that is used for the undercoating layer is a polymer, a copolymer of a monomer having an adsorbent group, a monomer having a hydrophilic group, and a monomer having a crosslinking group is preferred.

The adsorbent group that can be adsorbed to the surface of the support is preferably a phenolic hydroxy group, a carboxy group, —$PO_3H_2$, —$OPO_3H_2$, —$CONHSO_2$—, —$SO_2NHSO_2$—, or —$COCH_2COCH_3$. The hydrophilic group is preferably a sulfo group, a salt thereof, or a salt of a carboxy group. The crosslinking group is preferably an acrylic group, a methacryl group, an acrylamide group, a methacrylamide group, an allyl group, or the like.

The polymer may have a crosslinking group introduced due to the formation of a salt between a polar substituent of the polymer and a compound having a substituent having an opposite charge of the above-described polar substituent and an ethylenically unsaturated bond and may be further copolymerized with a monomer other than the above-described monomers, preferably, a hydrophilic monomer.

Specifically, preferred examples thereof include a silane coupling agent having an ethylenic double bond reactive group that is capable of addition polymerization described in JP1998-282679A (JP-H10-282679A) and a phosphorus compound having an ethylenic double bond reactive group described in JP1990-304441A (JP-H02-304441A). A low-molecular-weight or high-molecular-weight compound having a crosslinking group (preferably an ethylenically unsaturated bond group), a functional group that interacts with the surface of the support, and hydrophilic groups described in JP2005-238816A, JP2005-125749A, JP2006-239867A, and JP2006-215263A are also preferably used.

More preferred examples thereof include a high-molecular-weight polymer having an adsorbent group that can be adsorbed to the surface of the support, a hydrophilic group, and crosslinking groups described in JP2005-125749A and JP2006-188038A.

The content of the ethylenically unsaturated bond group in the polymer that is used in the undercoating layer is preferably 0.1 mmol to 10.0 mmol and more preferably 0.2 mmol to 5.5 mmol per gram of the polymer.

The weight average molecular weight (Mw) of the polymer that is used in the undercoating layer is preferably 5,000 or higher and more preferably 10,000 to 300,000.

In addition to the above-described compounds for the undercoating layer, the undercoating layer may also include a chelating agent, a secondary or tertiary amine, a polymerization inhibitor, a compound having an amino group or a functional group having a polymerization-inhibiting function and a group that interacts with the surface of support (for example, 1,4-diazabicyclo[2.2.2]octane (DABCO), 2,3,5,6-tetrahydroxy-p-quinone, chloranil, sulfophthalic acid, hydroxyethyl ethylene diamine triacetic acid, dihydroxyethyl ethylenediamine diacetic acid, hydroxyethyl iminodiacetic acid, and the like), and the like in order to prevent contamination over time.

The undercoating layer is coated using well-known coating methods. The coating amount (solid content) of the undercoating layer is preferably 0.1 mg/m$^2$ to 100 mg/m$^2$ and more preferably 1 mg/m$^2$ to 30 mg/m$^2$.

<Method for Manufacturing Lithographic Printing Plate Precursor>

The lithographic printing plate precursor can be manufactured by applying and drying coating fluids for the respective constituent layers according to an ordinary method to form the respective constituent layers.

The coating fluids for the respective constituent layers are produced by dissolving the components that are included in the respective constituent layers in a well-known solvent.

For application, a die coating method, a dip coating method, an air knife coating method, a curtain coating method, a roller coating method, a wire bar coating method, a gravure coating method, a slide coating method, or the like is used.

In addition, the lithographic printing plate precursor according to the embodiment of the present disclosure is not particularly limited, but it is possible to, for example, apply and then dry water on the image-recording layer after the formation of the image-recording layer, thereby unevenly distributing the hydrophilic polymer in the image-recording layer and setting the d0/d1 and the I1/I0 in the above-described ranges.

(Method for Producing Lithographic Printing Plate and Lithographic Printing Method)

A lithographic printing plate can be produced by carrying out a development process by subjecting the lithographic printing plate precursor of the embodiment of the present disclosure to image-wise exposure.

One aspect of a method for producing a lithographic printing plate according to an embodiment of the present disclosure includes a step of subjecting the lithographic printing plate precursor according to the embodiment of the present disclosure to image-wise exposure (exposure step) and a step of removing the image-recording layer in the non-image area by supplying at least any of printing ink or dampening water in a printer (on-machine development step).

One aspect of a lithographic printing method according to an embodiment of the present disclosure includes a step of subjecting the lithographic printing plate precursor according to the embodiment of the present disclosure to image-wise exposure (exposure step), a step of removing the image-recording layer in the non-image area by supplying at least any of printing ink or dampening water in a printer to produce a lithographic printing plate, and a step of carrying out printing using the obtained lithographic printing plate.

Hereinafter, regarding the method for producing a lithographic printing plate according to the embodiment of the present disclosure and a lithographic printing method according to an embodiment of the present disclosure, preferred aspects of the respective steps will be sequentially described. Meanwhile, the lithographic printing plate precursor of the embodiment of the present disclosure can also be developed using a development fluid.

In addition, a preferred aspect of the exposure step and the on-machine development step in the method for producing a lithographic printing plate according to the embodiment of the present disclosure and a preferred aspect of the exposure step and the on-machine development step in the lithographic printing method according to the embodiment of the present disclosure are identical to each other.

<Exposure Step>

The method for producing a lithographic printing plate according to the embodiment of the present disclosure preferably includes an exposure step of subjecting the lithographic printing plate precursor according to the embodiment of the present disclosure to image-wise exposure and forming an image area and a non-image area.

The lithographic printing plate precursor is preferably an on-machine development-type lithographic printing plate precursor.

In addition, in a case where the lithographic printing plate precursor is a negative-type lithographic printing plate precursor, an exposed region (exposed portion) turns into the image area, and a non-exposed region (non-exposed portion) turns into the non-image area.

In the exposure step, the lithographic printing plate precursor according to the embodiment of the present disclosure is preferably subjected to image-wise exposure by laser exposure through a transparent original image having a linear image, a halftone dot image, or the like or by laser light scanning according to digital data.

As the wavelength of a light source, a range of 750 nm to 1,400 nm is preferably used. The light source having a wavelength in a range of 750 nm to 1,400 nm is preferably a solid-state laser or a semiconductor laser that radiates infrared rays. Regarding an infrared laser, the output is preferably 100 mW or more, the exposure time per pixel is preferably 20 microseconds or shorter, and the irradiation energy amount is preferably 10 $mJ/cm^2$ to 300 $mJ/cm^2$. In addition, in order to shorten the exposure time, a multibeam laser device is preferably used. The exposure mechanism may be any one of an in-plane drum method, an external surface drum method, a flat head method, or the like.

The image exposure can be carried out using a platesetter or the like and an ordinary method. In the case of on-machine development, image exposure may be carried out on a printer after the lithographic printing plate precursor is mounted on the printer.

<On-Machine Development Step>

The method for producing a lithographic printing plate according to the embodiment of the present disclosure preferably includes an on-machine development step of removing the non-exposed portion by supplying at least any of printing ink or dampening water in this order.

In addition, the method for producing a lithographic printing plate according to the embodiment of the present disclosure may be carried out using a development method using a development fluid (development fluid treatment method).

Hereinafter, the on-machine development method will be described.

[On-Machine Development Method]

In the on-machine development method, a lithographic printing plate is preferably produced by supplying ink and an aqueous component to the lithographic printing plate precursor subjected to image-wise exposure on a printer and removing the image-recording layer in a non-image area.

As the ink, oil-based ink is used, and ultraviolet-curable ink other than aqueous ink is also added to the oil-based ink.

That is, in a case where the lithographic printing plate precursor is subjected to image-wise exposure and then mounted as it is in a printer without carrying out any development process thereon or the lithographic printing plate precursor is mounted in a printer, then, subjected to image-wise exposure on a printer, and subsequently supplied with at least any of ink or an aqueous component (for example, a composition used as dampening water or the like) to carry out printing, in an initial stage in the middle of printing, the image-recording layer in the non-image area is dissolved or dispersed and thus removed by at least any of the supplied ink or aqueous component, and the hydrophilic surface is exposed in the removed portion. On the other hand, in an image area, for example, the image-recording layer cured by exposure forms an ink-receiving portion having a lipophilic surface. Any of the ink or the aqueous component may be supplied to the surface of the plate in the beginning; however, from the viewpoint of preventing contamination by a component of the image-recording layer from which the aqueous component is removed, the ink is preferably supplied in the beginning. In the above-described manner, the lithographic printing plate precursor is on-machine-developed on the printer and is used as it is for printing a number of pieces of paper. As the ink and the aqueous component, ordinary printing ink and ordinary dampening water for lithographic printing are preferably used.

<Printing Step>

The lithographic printing method according to the embodiment of the present disclosure includes a step of carrying out printing using the lithographic printing plate obtained by the on-machine development step.

Specifically, the step is a step of carrying out printing on a recording medium by supplying printing ink to the obtained lithographic printing plate.

The printing ink is not particularly limited, and a variety of well-known inks can be used as desired. In addition, as the printing ink, oil-based ink is preferably exemplified.

In addition, in the printing step, dampening water may be supplied as necessary.

In addition, the printing step may be successively carried out after the on-machine development step without stopping the printer.

The recording medium is not particularly limited, and a well-known recording medium can be used as desired.

In the method for producing the lithographic printing plate from the lithographic printing plate precursor according to the embodiment of the present disclosure and the lithographic printing method according to the embodiment of the present disclosure, the full surface of the lithographic printing plate precursor may be heated as necessary before exposure, in the middle of exposure, or during a period of time from exposure to development.

Such heating accelerates an image-forming reaction in the image-recording layer and generates an advantage of the improvement in sensitivity or printing resistance, the stabilization of sensitivity, or the like. Heating before development is preferably carried out in a mild condition of 150° C. or lower. In the above-described aspect, it is possible to prevent a problem of the curing of the non-image area. For heating after development, an extremely strong condition is preferably used, and a range of 100° C. to 500° C. is preferred. In the above-described range, a sufficient image-strengthening action is obtained, and it is possible to suppress the deterioration of the support or the thermal decomposition of the image area.

EXAMPLES

Hereinafter, the present disclosure will be described in detail using examples, but the present disclosure is not limited thereto. In the present examples, "%" and "parts" indicate "% by mass" and "parts by mass" unless particularly otherwise described. For polymer compounds, unless particularly otherwise described, the molecular weight refers to the weight-average molecular weight (Mw), and the ratio of a constituent repeating unit is the molar percentage. In addition, the weight-average molecular weight (Mw) is a value measured as a polystyrene equivalent value by the gel permeation chromatography (GPC) method.

Examples 1 to 30 and Comparative Examples 1 to 5

<Production of Support>

In order to remove rolling oil on the surface of a 0.3 mm-thick aluminum plate (material JIS A 1050), a defatting process was carried out thereon using a 10% by mass aqueous solution of sodium aluminate at 50° C. for 30 seconds, and then the surface of the aluminum plate was grained using three implanted nylon brushes having a hair diameter of 0.3 mm and a suspension of pumice having a median diameter of 25 μm and water (specific gravity: 1.1 g/cm$^3$) and well washed with water. The aluminum plate was etched by being immersed in a 25% by mass aqueous solution of sodium hydroxide at 45° C. for nine seconds, was washed with water, then, was further immersed in a 20% by mass aqueous solution of nitric acid at 60° C. for 20 seconds, and was washed with water. The etching amount of the grained surface was approximately 3 g/m$^2$.

Next, an electrochemical roughening process was continuously carried out thereon using an alternating current voltage of 60 Hz. An electrolytic solution was a 1% by mass aqueous solution of nitric acid (including 0.5% by mass of aluminum ions), and the liquid temperature was 50° C. The electrochemical roughening process was carried out thereon using an alternating current power supply waveform in which the time TP taken for the current value to reach the peak from zero was 0.8 ms and the duty ratio was 1:1, and the electrochemical roughening process was carried out using a trapezoidal rectangular wave alternating current and a carbon electrode as a counter electrode. As an auxiliary anode, ferrite was used. The current density was 30 A/dm$^2$ in terms of the peak value of the current, and 5% of the current coming from the power supply was divided into the auxiliary anode. Regarding the quantity of electricity during nitric acid electrolysis, the quantity of electricity was 175 C/dm$^2$ in a case where the aluminum plate served as the positive electrode. After that, the plate was washed with water by means of spraying.

Subsequently, an electrochemical roughening process was carried out thereon using the same method as nitric acid electrolysis in a 0.5% by mass aqueous solution of hydrochloric acid (including 0.5% by mass of aluminum ions) and an electrolytic solution having a liquid temperature of 50° C. under a condition of the quantity of electricity of 50 C/dm$^2$ in a case where the aluminum plate served as the positive electrode, and then, the plate was washed with water by means of spraying.

Next, 2.5 g/m$^2$ of a direct current anode oxide film was formed on the aluminum plate at a current density of 15 A/dm$^2$ using a 15% by mass aqueous solution of sulfuric acid (including 0.5% by mass of aluminum ions.) as an electrolytic solution and then washed with water and dried, thereby producing a support. The average pore diameter in the surface layer of the anode oxide film (surface average pore diameter) was 10 nm.

The pore diameter in the surface layer of the anode oxide film was measured using a method in which the surface was observed an ultrahigh resolution SEM (S-900 manufactured by Hitachi, Ltd.) at a relatively low acceleration voltage of 12 V at a magnification of 150,000 times without carrying out a vapor deposition process or the like for imparting conductive properties, 50 pores were randomly extracted, and the average value was obtained. The average value of the standard deviation errors was ±10% or less.

<Formation of Image-Recording Layer>

An undercoating fluid (1) having the following composition was applied onto the support so that the dried coating amount reached 20 mg/m$^2$ and dried in an oven at 100° C. for 30 seconds, thereby producing a support to be used the following experiments.

A coating fluid for an image-recording layer (1) having the following composition or a coating fluid for an image-recording layer (2) having the following composition was applied onto the support on which the undercoating layer was formed by means of bar coating and dried in the oven at 100° C. for 60 seconds, thereby forming an image-recording layer having a dried coating amount of 1.0 mg/m$^2$.

Which of the coating fluid for an image-recording layer (1) and the coating fluid for an image-recording layer (2) was used in individual examples is shown in the column "coating fluid for image-recording layer" in Table 1 or Table 2.

After that, 0.3 g/m$^2$ of water was applied onto the image-recording layer by means of bar coating and dried in the oven at 100° C. for 60 seconds.

Meanwhile, only in Comparative Example 2, the following coating fluid for an image-recording layer (1) was applied by means of bar coating and dried in the oven at 100° C. for 60 seconds, thereby forming an image-recording layer having a dried coating amount of 1.0 mg/m$^2$.

After that, 0.3 g/m$^2$ of water was applied onto the image-recording layer by means of bar coating and dried in the oven at 150° C. for 60 seconds.

In addition, regarding Comparative Example 4, the following coating fluid for an image-recording layer (1) was applied by means of bar coating and dried in the oven at 100° C. for 60 seconds, thereby forming an image-forming layer having a dried coating amount of 1.0 mg/m$^2$.

After that, 0.3 g/m$^2$ of an aqueous solution containing HPC SSL 40,000 (30 parts) was applied onto the image-recording layer by means of bar coating and dried in the oven at 150° C. for 60 seconds.

[Undercoating Fluid (1)]

Undercoating compound 1 described below: 0.18 parts

Methanol: 55.24 parts

Distilled water: 6.15 parts

—Synthesis of Undercoat Compound 1—

<<Purification of Monomer M-1>>

LIGHT ESTER P-1M (2-methacryloyloxyethyl acid phosphate, manufactured by Kyoeisha Chemical Co., Ltd.) (420 parts), diethylene glycol dibutyl ether (1,050 parts), and distilled water (1,050 parts) were added to a separating funnel, strongly stirred, and then left to stand. The upper layer was disposed of, diethylene glycol dibutyl ether (1,050 parts) was added thereto, and the components were strongly stirred and then left to stand. The upper layer was disposed of, thereby obtaining an aqueous solution of a monomer M-1 (1,300 parts, 10.5% by mass in terms of the solid content).

<<Synthesis of Undercoat Compound 1>>

Distilled water (53.73 parts) and the monomer M-2 (3.66 parts) shown below were added to a three-neck flask and heated to 55° C. in a nitrogen atmosphere. Next, a dropwise addition liquid 1 described below was added dropwise thereto for two hours, the components were stirred for 30 minutes, then, VA-046B (manufactured by Wako Pure Chemical Industries Ltd.) (0.386 parts) was added thereto, and the components were heated to 80° C. and stirred for 1.5 hours. The reaction liquid was returned to room temperature (25° C.), then, a 30% by mass aqueous solution of sodium hydroxide was added thereto to adjust the pH to 8.0, and then 4-hydroxy-2,2,6,6-tetramethylpiperidine-1-oxyl (4-OH-TEMPO, 0.005 parts) was added thereto. An aqueous solution of an undercoat compound 1 (180 parts) was obtained by the above-described operation. The weight average molecular weight (Mw) converted to a polyethylene glycol equivalent value by the gel permeation chromatography (GPC) method was 170,000.

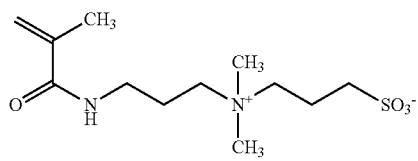

Monomer M-2

<<Dropwise Addition Liquid 1>>
The aqueous solution of the monomer M-1: 87.59 parts
The monomer M-2: 14.63 parts
VA-046B (2,2'-azobis[2-(2-imidazolin-2-yl)propane] disulfate dehydrate, manufactured by Wako Pure Chemical Industries Ltd.): 0.386 parts
Distilled water: 20.95 parts
[Coating Fluid for Image-Recording Layer (1)]
Polymerizable compound*[1]: 0.325 parts
Graft copolymer 1*[2]: 0.060 parts
Graft copolymer 2*[3]: 0.198 parts
Mercapto-3-triazole*[4]: 0.180 parts
Irgacure 250*[5]: 0.032 parts
Infrared absorber 1 (the following structure): 0.007 parts
Sodium tetraphenylborate (the following structure): 0.04 parts
Byk 336*[6]: 0.015 parts
n-Propanol: 7.470 parts
Water: 1.868 parts
Hydrophilic polymer (a compound shown in Table 1 or Table 2): Amount shown in Table 1 or Table 2
*1: Dipentaerythritol hexaacrylate (manufactured by Shin-Nakamura Chemical Co., Ltd.).
*2: The graft polymer 1 is a polymer grafted by poly(oxy-1,2-ethanediyl), α-(2-methyl-1-oxo-2-propenyl)-ω-methoxy-, and ethenyl benzene and is a dispersion body of containing 25% by mass of this polymer in a solvent of n-propanol and water in a mass ratio of 80/20.

*3: The graft polymer 2 is a polymer particle of a graft copolymer of poly(ethylene glycol) methyl ether methacrylate, styrene, and acrylonitrile (10:9:81) and is a dispersion body containing 24% by mass of this polymer particle in a solvent of n-propanol and water in a mass ratio of 80/20. In addition, the volume-average particle diameter thereof is 193 nm.
*4: Mercapto-3-triazole is mercapto-triazole-1H,2,4 that can be procured from PCAS (France).
*5: Irgacure 250 is a 75% propylene carbonate solution of iodonium (4-methylphenyl)[4-(2-methylpropyl)phenyl] hexafluorophosphate that can be procured from Ciba Specialty Chemicals Inc.
*6: Byk 336 is a modified dimethyl polysiloxane copolymer, which can be procured from Byk Chemie GmbH, in a 25% by mass xylene/methoxypropyl acetate solution.

—Synthesis of Graft Copolymer 2—

A solution of polyethylene glycol methyl ether methacrylate (PEGMA) (20 parts) dissolved in a mixture of deionized water (50.5 parts) and n-propanol (242.2 parts) was charged into a four-neck flask and slowly heated until slightly refluxing in a $N_2$ atmosphere (up to 73° C.). A pre-mixture of styrene (9 parts), acrylonitrile (81 parts), and VAZO-64 (2,2'-azobis(isobutyronitrile), 0.7 parts) was added thereto for two hours. After six hours, VAZO-64 (0.5 parts) was further added thereto. The temperature was increased up to 80° C. Subsequently, VAZO-64 (0.7 parts) was added thereto for 12 hours. After a reaction for a total of 20 hours, the conversion rate to a graft polymer was >98% on the basis of the measurement of a non-volatile percentage. The mass ratio of PEGMA/styrene/acrylonitrile was 10:9:81, and the ratio of n-propanol/water was 80:20. The number average particle diameter of this polymer particle was 200 nm.

Here, the number average particle diameter is an average value of a total of 500 circle-equivalent diameters of particles measured on a captured electron micrograph of the polymer particles. The circle-equivalent diameter refers to the diameter of a circle having the same area as the projected area in the photograph of the particle.

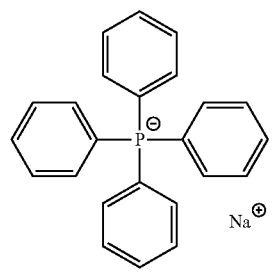

Sodium tetraphenylborate

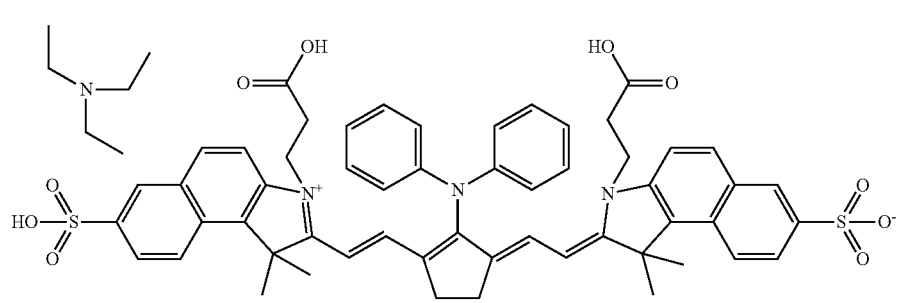

Infrared absorber 1

[Coating Fluid for Image-Recording Layer (2)]
Binder polymer (1) [the following structure]: 0.240 parts
Infrared absorber (2) [the following structure]: 0.030 parts
Polymerizable initiator (1) [the following structure]: 0.162 parts
Polymerizable compound (tris(acryloyloxyethyl)isocyanurate, NK ester A-9300, manufactured by Shin-Nakamura Chemical Co., Ltd.): 0.192 parts
Tris(2-hydroxyethyl)isocyanurate: 0.062 parts
Benzyl-dimethyl-octyl ammonium.PF$_6$ salt: 0.018 parts
Ammonium group-containing polymer [a structure of the following reference sign (15)]: 0.010 parts
Fluorine-based surfactant (1) [the following structure]: 0.008 parts
Methyl ethyl ketone: 1.091 parts
1-Methoxy-2-propanol: 8.609 parts
Polymer particle (hydrophobilization precursor) water dispersion: 5.065 parts
Hydrophilic polymer (a compound shown in Table 1 or Table 2): Amount shown in Table 1 or Table 2 recording layer were measured. d0/d1 and I1/I0 were computed from the measurement values, and the results are shown in Table 1 or Table 2.

The hydrophilic polymer is hydroxypropyl cellulose: $C_3H_7O^+$

The hydrophilic polymer is methyl cellulose: $C_3H_3O_2^-$

The hydrophilic polymer is polyvinyl alcohol (PVA): $C_4H_5O^-$

The hydrophilic polymer is polyvinyl pyrrolidone (PVP): $C_6H_{10}NO^+$

The hydrophilic polymer is polyethylene glycol (PEG): $C_2H_5O^+$

[On-Machine Developability]

The lithographic printing plate precursor obtained in each example was exposed using a LUXEL PLATESETTER T-6000III manufactured by Fujifilm Corporation equipped with an infrared semiconductor laser under conditions of an external surface drum rotation speed of 1,000 rpm, a laser output of 70%, and a resolution of 2,400 dpi (dot per inch,

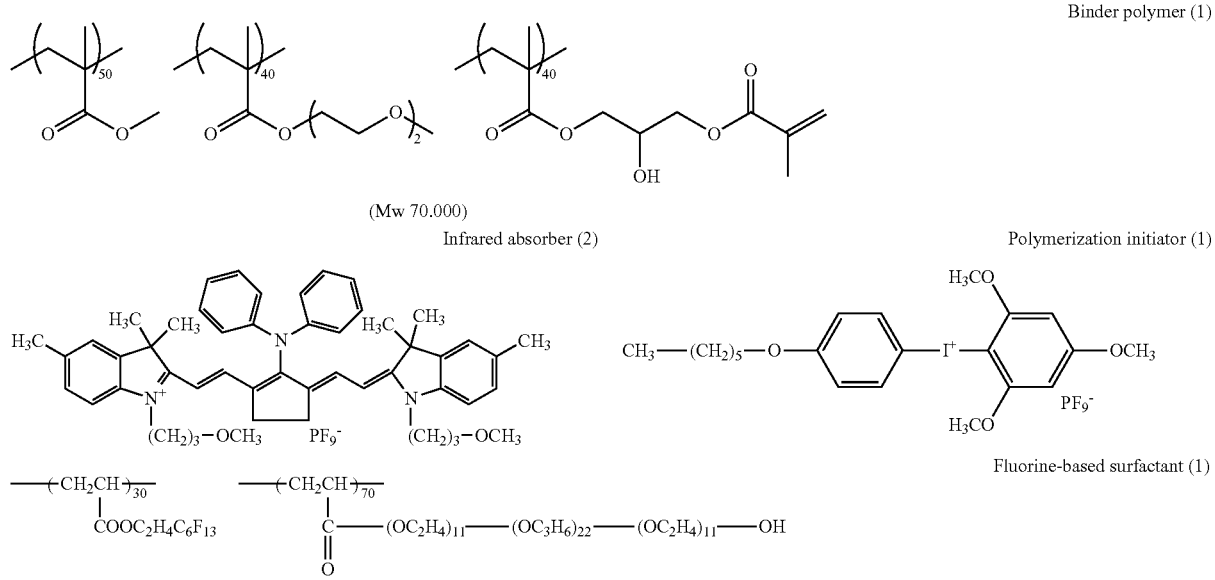

1 inch=2.54 cm). An exposed image was provided with a solid image and a 50% halftone dot chart of a 20 m dot FM screen.

<Evaluation>
[Measurement of Water Contact Angle]

In the lithographic printing plate precursors in the respective examples, the water contact angles of the image-recording layer surfaces were measured, and the measurement results are shown in Table 1 or Table 2. The water contact angle was measured using a method in which water was brought into contact with the image-recording layer surface using a contact angle meter DMo-501 (manufactured by Kyowa Interface Science Co., Ltd.).

[Measurement of I0, I1, d0, and d1]

In the lithographic printing plate precursors in the respective examples, I0, I1, d0, and d1 in the image-recording layer were analyzed by the above-described methods using TOF-SIMS (product of Ulvac-Phi, Inc.), and the peak intensities of the following ions were measured according to the kind of the hydrophilic polymer (primary ion: $Bi_3^{++}$, 30 kV).

The image-recording layer was cut from the surface using an Ar gas cluster ion beam ($Ar_{2500}^+$, 15 kV, 2.5 nA), the peak intensities of the following ions were plotted with respect to individual depths, and I0, I1, d0, and d1 in the image- Without carrying out a development process on the exposed plate precursors, the plate precursors were attached to the plate cylinder of a printer LITHRONE 26 manufactured by Komori Corporation. The plate precursors were on-machine-developed by supplying dampening water and ink using dampening water of ECOLITY-2 (manufactured by Fujifilm Corporation)/tap water=2/98 (capacity ratio) and SPACE COLOR FUSION G BLACK INK (manufactured by DIC Graphics Corporation) and the standard automatic printing start method of LITHRONE 26, and then printing was carried out on 500 pieces of TOKUBISHI art (manufactured by Mitsubishi Paper Mills Ltd., ream weight: 76.5 kg) at a printing rate of 10,000 pieces per hour.

The on-machine development of the non-image area in the image-recording layer on the printer was completed, and the number of pieces of printing paper necessary until a state in which ink was not transferred to the non-exposed portion was formed was measured as on-machine developability.

The above-described number of pieces is shown in Table 1 or Table 2 as evaluation results. It can be said that, as the number of pieces decreases, the lithographic printing plate precursor becomes more favorable in terms of the on-machine developability.

[Scratch Resistance (Scratch Sensitivity)]

A scratch test was carried out using a scratch intensity tester manufactured by Shinto Scientific Co., Ltd. by applying a load from 5 g to 100 g to a 0.1 mm-diameter sapphire needle in increments of 5 g and scanning the surfaces of individual specimens of the lithographic printing plate precursors, a load when a scratch was generated was measured, and the presence and absence of a deficit on the image area by a scratch damage and the occurrence of poor development of the non-image area and ink contamination were visually observed.

The lithographic printing plate precursors of the respective examples and the respective comparative examples were placed in Kodak (registered trademark) Trendsetter 800II Quantum platesetter (exposure wavelength: 830 nm) and exposed using an infrared (IR) laser having a wavelength of 830 nm so that both an exposed image including a solid image and a 50% halftone dot chart of a 20 m-dot frequency modulation (FM) screen and a non-image area were included in a scratched portion. Without carrying out a development process on the obtained exposed lithographic printing plate precursors, the plate precursors were attached to the plate cylinder of a printer LITHRONE 26 manufactured by Komori Corporation. The plate precursors were on-machine-developed by supplying dampening water and ink using dampening water of ECOLITY-2 (manufactured by Fujifilm Corporation)/tap water=2/98 (capacity ratio) and SPACE COLOR FUSION G BLACK INK (manufactured by DIC Graphics Corporation) and the standard automatic printing start method of LITHRONE 26, and then printing was carried out on 500 pieces of TOKUBISHI art (manufactured by Mitsubishi Paper Mills Ltd., ream weight: 76.5 kg) at a printing rate of 10,000 pieces per hour.

The maximum load on the obtained $500^{th}$ printed matter at which a deficit on the image area by a scratch damage, poor development of the non-image area, or ink contamination did not occur was evaluated into the following five levels.

Evaluation 1: The maximum load is 20 g or less.
Evaluation 2: The maximum load is more than 20 g and 40 g or less.
Evaluation 3: The maximum load is more than 40 g and 60 g or less.
Evaluation 4: The maximum load is more than 60 g and 80 g or less.
Evaluation 5: The maximum load is more than 80 g.

[Ink-Absorbing Property (Ink-Absorbing Property in Initial Phase of Printing)]

The lithographic printing plate exposed under the same exposure conditions as in the exposure in the evaluation of on-machine developability (so that a solid image and a 50% halftone dot chart of a 20 μm-dot FM screen were included in an exposed image) was attached to a plate cylinder of a printer LITHRONE26 manufactured by Komori Corporation. Printing was initiated by supplying dampening water and ink using dampening water of ECOLITY-2 (manufactured by Fujifilm Corporation)/tap water=2/98 (capacity ratio) and Values-G(N) BLACK INK (manufactured by DIC Graphics Corporation) and the standard automatic printing start method of LITHRONE 26, and then printing was carried out on 100 pieces of TOKUBISHI art (manufactured by Mitsubishi Paper Mills Ltd., ream weight: 76.5 kg) at a printing rate of 10,000 pieces per hour.

The ink concentration in a solid image portion was measured using a Macbeth densitometer (manufactured by X-Rite Inc., exact), and the number of pieces of printing paper necessary until the ink concentration reached 1.0 or more was measured as an index of an ink-absorbing property (an ink-absorbing property in the initial phase of printing). It can be said that, as the number of pieces decreases, the lithographic printing plate becomes more favorable in terms of the ink-absorbing property.

TABLE 1

| | Coating fluid for image-recording layer | Hydrophilic polymer | Compound added(parts) | Contact angle (°) | d0/d1 | l1/l0 | On-machine developability (pieces) | Ink-absorbing property (pieces) | Scratch resistance |
|---|---|---|---|---|---|---|---|---|---|
| Example 1 | (1) | 60SH-4000 | 0.05 | 66 | 2.1 | 1.7 | 14 | 8 | 3 |
| Example 2 | (1) | 60SH-15 | 0.05 | 67 | 2.1 | 1.7 | 14 | 8 | 3 |
| Example 3 | (1) | 65SH-50 | 0.05 | 57 | 6 | 2.4 | 8 | 8 | 3 |
| Example 4 | (1) | SM-04 | 0.05 | 68 | 2.1 | 1.6 | 14 | 8 | 3 |
| Example 5 | (1) | Klucel EF Pharm | 0.05 | 58 | 5 | 2.7 | 8 | 8 | 1 |
| Example 6 | (1) | NISSO HPC SSL | 0.05 | 54 | 20 | 2.8 | 8 | 8 | 1 |
| Example 7 | (1) | NISSO HPC SL | 0.05 | 55 | 10 | 2.3 | 8 | 8 | 1 |
| Example 8 | (1) | CKS-50 | 0.05 | 61 | 2.6 | 1.9 | 14 | 8 | 2 |
| Example 9 | (1) | Rubitec VA64W | 0.05 | 60 | 3.1 | 1.9 | 12 | 8 | 2 |
| Example 10 | (1) | Pitzkol K-17 | 0.05 | 59 | 3.1 | 2.5 | 10 | 8 | 1 |
| Example 11 | (1) | Luviskol K-17 | 0.05 | 60 | 3.1 | 2.5 | 10 | 8 | 1 |
| Example 12 | (1) | Pluronic L-44 | 0.05 | 60 | 3.5 | 2.6 | 10 | 8 | 1 |
| Example 13 | (1) | Polyethylene Glycol 6.000 | 0.05 | 60 | 3.5 | 2.6 | 10 | 8 | 1 |
| Example 14 | (1) | Polyethylene Glycol 1.000 | 0.05 | 61 | 4.2 | 2.7 | 10 | 8 | 1 |
| Example 15 | (1) | NISSO HPC SSL | 0.01 | 68 | 2.4 | 1.6 | 20 | 8 | 3 |
| Example 16 | (1) | NISSO HPC SSL | 0.025 | 60 | 2.9 | 1.9 | 14 | 8 | 2 |
| Example 17 | (1) | NISSO HPC SSL | 0.08 | 55 | 10 | 2.2 | 8 | 8 | 1 |
| Example 18 | (1) | NISSO H PC SSL | 0.1 | 51 | 33 | 3.1 | 8 | 10 | 1 |
| Example 19 | (1) | NISSO HPC SSL | 0.2 | 48 | 45 | 3.8 | 6 | 15 | 1 |
| Example 20 | (2) | 60SH-4000 | 0.05 | 66 | 2.2 | 1.7 | 14 | 8 | 3 |
| Example 21 | (2) | 60SH-15 | 0.05 | 67 | 2.2 | 1.7 | 14 | 8 | 3 |
| Example 22 | (2) | 65SH-50 | 0.05 | 57 | 6 | 2.4 | 8 | 8 | 3 |
| Example 23 | (2) | SM-04 | 0.05 | 66 | 2 | 1.6 | 14 | 8 | 3 |

TABLE 1-continued

| | Coating fluid for image-recording layer | Hydrophilic polymer | Compound added(parts) | Contact angle (°) | d0/d1 | I1/I0 | Evaluation results On-machine developability (pieces) | Ink-absorbing property (pieces) | Scratch resistance |
|---|---|---|---|---|---|---|---|---|---|
| Example 24 | (2) | Klucel EF Pharm | 0.05 | 58 | 4.8 | 2.7 | 8 | 8 | 1 |
| Example 25 | (2) | NISSO HPC SSL | 0.05 | 54 | 18.6 | 2.8 | 8 | 8 | 1 |
| Example 26 | (2) | NISSO HPC SL | 0.05 | 55 | 9.4 | 2.3 | 8 | 8 | 1 |
| Example 28 | (2) | CKS-50 | 0.05 | 61 | 2.8 | 1.9 | 14 | 8 | 2 |
| Example 29 | (2) | Rubitec VA64W | 0.05 | 60 | 3.4 | 1.9 | 12 | 8 | 2 |
| Example 30 | (2) | Pitzkol K-17 | 0.05 | 59 | 3.5 | 2.5 | 10 | 8 | 1 |
| Example 31 | (2) | Luviskol K-17 | 0.05 | 60 | 3.3 | 2.5 | 10 | 8 | 1 |
| Example 32 | (2) | Pluronic L-44 | 0.05 | 60 | 3.6 | 2.6 | 10 | 8 | 1 |
| Example 33 | (2) | Polyethylene Glycol 6.000 | 0.05 | 60 | 3.5 | 2.6 | 10 | 8 | 1 |

TABLE 2

| | Coating fluid for image-recording layer | Hydrophilic polymer | Compound added(parts) | Contact angle (°) | d0/d1 | I1/I0 | Evaluation results On-machine developability (pieces) | Ink-absorbing property (pieces) | Scratch resistance |
|---|---|---|---|---|---|---|---|---|---|
| Example 34 | (2) | Polyethylene Glyco) 1.000 | 0.05 | 61 | 4.5 | 2.7 | 10 | 8 | 1 |
| Example 35 | (2) | NISSO HPC SSL | 0.01 | 67 | 2.3 | 1.6 | 20 | 8 | 3 |
| Example 36 | (2) | NISSO HPC SSL | 0.025 | 60 | 2.8 | 1.9 | 14 | 8 | 2 |
| Example 37 | (2) | NISSO HPC SSL | 0.08 | 55 | 9.7 | 2.2 | 8 | 8 | |
| Example 38 | (2) | NISSO HPC SSL | 0.1 | 51 | 32.4 | 3.1 | 8 | 10 | 1 |
| Example 39 | (2) | NISSO HPC SSL | 0.2 | 48 | 44.1 | 3.8 | 6 | 15 | 1 |
| Comparative Example 1 | (1) | none | — | 91 | — | — | 100 | 8 | 5 |
| Comparative Example 2 | (1) | NISSO HPC SSL | 0.005 | 81 | 1.7 | 1.2 | 50 | 8 | 4 |
| Comparative Example 3 | (1) | Poly(methyl methacrylate) average Mw ~15.000 by GPC. powder (product of Sigma-Aldrich Corporation) | 0.05 | 85 | 1.8 | 1.1 | 100 | 8 | 5 |
| Comparative Example 4 | (1) | NISSO HPC SSL | 0.01 | 43 | Not measurable | Not measurable | 10 | 50 | 1 |
| Comparative Example 5 | (2) | none | — | 90 | — | — | 100 | 8 | 5 |

In Table 1 or Table 2, for examples having a value "None" shown in the column "Hydrophilic polymer", the hydrophilic polymer was not contained.

In Comparative Example 3, polymethyl methacrylate (PMMA) which is not hydrophilic was used instead of the hydrophilic polymer. Therefore, in the columns "d0/d1" and "I1/I0", individual numeric values in the case of detecting not the hydrophilic polymer but PMMA are shown.

In Comparative Example 4, the layer including the hydrophilic polymer (HPC SSL 40,000) was provided on the image-recording layer, but the hydrophilic polymer was not included in the image-recording layer, and d0/d1 and I1/I0 could not be measured, and thus "Not measurable" is shown in the columns "d0/d1" and "I1/I0".

In addition, the details of the hydrophilic polymers shown in Table 1 or Table 2 are as described below.

TABLE 3

| Compound type | Manufacturer | Item | cLogP value |
|---|---|---|---|
| Cellulose | Shin-Etsu Chemical Co., Ltd. | 60SH-4000 | 0.4 |
| | | 60SH-15 | 0.4 |
| | | 65SH-50 | 0.45 |
| | | SM-04 | 0.48 |
| | Ashland | Klucel EF Pharm | −2.2 |
| | Nippon Soda Co., Ltd. | NISSO HPC SSL | −2.2 |
| | | NISSO HPC SL | −2.2 |
| PVA | GOHSERAN | CKS-50 | −0.2 |
| Vinylpyrrolidone | DAIICHI KOGYO Co., Ltd. | Pitzkol K-17L | −0.5 |
| | BASF | Luviskol K-17 | −0.2 |
| | | Rubitec VA64W | −0.9 |
| PEG | ADEKA | Pluronic L-44 | −0.9 |
| | Tokyo Chemical Industry Co., Ltd. | Polyethylene Glycol 6,000 | −0.9 |
| | Wako Pure Chemical Industries, Ltd. | Polyethylene Glycol 1,000 | −0.9 |

The disclosure of JP2017-167434 filed on Aug. 31, 2017 is wholly incorporated into the present specification by reference.

All of documents, patent applications, and technical standards described in the present specification are incorporated into the present specification by reference to approximately the same extent as a case where it is specifically and respectively described that the respective documents, patent applications, and technical standards are incorporated by reference.

What is claimed is:

1. A lithographic printing plate precursor, comprising:
a support; and
an image-recording layer as an outermost surface layer on the support,
wherein the image-recording layer comprises a hydrophilic polymer,
an ion intensity derived from the hydrophilic polymer has a maximum value I1, the ion intensity being measured by a time-of-flight secondary ion mass spectrometry in such a manner that cutting is carried out from an image-recording layer surface in a direction of the support by an Ar gas cluster ion beam method,
a ratio d0/d1 of a thickness d0 of the image-recording layer to a depth d1 from an outermost layer at which the I1 is obtained is 2.0 or more, and
a ratio I1/I0 of the I1 to an ion intensity I0 derived from the hydrophilic polymer at a depth from the outermost layer of the d0 is 1.5 or more.

2. The lithographic printing plate precursor according to claim 1,
wherein the d0/d1 is 2.5 or more, and the I1/I0 is 1.8 or more.

3. The lithographic printing plate precursor according to claim 1,
wherein the hydrophilic polymer comprises a polysaccharide.

4. The lithographic printing plate precursor according to claim 1,
wherein the hydrophilic polymer comprises a water-soluble cellulose compound.

5. The lithographic printing plate precursor according to claim 1,
wherein the hydrophilic polymer comprises hydroxyalkyl cellulose.

6. The lithographic printing plate precursor according to claim 1,
wherein a content of the hydrophilic polymer is 0.1% by mass to 20% by mass with respect to a total mass of the image-recording layer.

7. The lithographic printing plate precursor according to claim 1,
wherein a water contact angle of the image-recording layer surface is 45° to 700.

8. The lithographic printing plate precursor according to claim 1,
wherein the image-recording layer further comprise an infrared absorber, a polymerization initiator, and a polymerizable compound.

9. The lithographic printing plate precursor according to claim 1,
wherein the image-recording layer further comprises a polymer particle.

10. The lithographic printing plate precursor according to claim 9,
wherein the polymer particle comprises a styrene-acrylonitrile copolymer.

11. The lithographic printing plate precursor according to claim 1,
wherein the image-recording layer further comprises an acid color former.

12. The lithographic printing plate precursor according to claim 8,
wherein the polymerization initiator comprises an electron-donating polymerization initiator and an electron-receiving polymerization initiator.

13. The lithographic printing plate precursor according to claim 1, which is an on-machine development-type lithographic printing plate precursor.

14. A method for producing a lithographic printing plate, comprising:
subjecting the lithographic printing plate precursor according to claim 1 to image-wise light exposure; and
removing an image-recording layer in a non-image area by supplying at least one selected from the group consisting of printing ink and dampening water in a printer.

15. A lithographic printing method, comprising:
subjecting the lithographic printing plate precursor according to claim 1 to image-wise light exposure;
removing a non-image area in an image-recording layer in a printer by supplying at least one selected from the group consisting of printing ink and dampening water to produce a lithographic printing plate; and
carrying out printing using the obtained lithographic printing plate.

* * * * *